(12) United States Patent
Tsai

(10) Patent No.: US 11,934,097 B2
(45) Date of Patent: *Mar. 19, 2024

(54) IMPRINTING METHOD USING A SOLVENT TO REMOVE A MOLD AND THE RELATED IMPRINTING SYSTEM

(71) Applicant: EVER RADIANT INCORPORATION, Tainan (TW)

(72) Inventor: Sung-Wen Tsai, Tainan (TW)

(73) Assignee: EVER RADIANT INCORPORATION, Tainan (TW)

(*) Notice: Subject to any disclaimer, the term of this patent is extended or adjusted under 35 U.S.C. 154(b) by 509 days.

This patent is subject to a terminal disclaimer.

(21) Appl. No.: 17/197,255

(22) Filed: Mar. 10, 2021

(65) Prior Publication Data

US 2021/0200080 A1 Jul. 1, 2021

Related U.S. Application Data

(63) Continuation-in-part of application No. 16/738,201, filed on Jan. 9, 2020, now Pat. No. 11,613,065.

(30) Foreign Application Priority Data

Oct. 4, 2019 (TW) .................................. 108135978

(51) Int. Cl.
  *B29C 33/38* (2006.01)
  *B29C 59/02* (2006.01)
  *G03F 7/00* (2006.01)

(52) U.S. Cl.
  CPC ........ *G03F 7/0002* (2013.01); *B29C 33/3885* (2013.01); *B29C 59/022* (2013.01)

(58) Field of Classification Search
  CPC .... G03F 7/0002; B29C 33/385; B29C 59/022

USPC .......................................................... 264/219
  See application file for complete search history.

(56) References Cited

U.S. PATENT DOCUMENTS

| | | | |
|---|---|---|---|
| 6,849,558 B2 * | 2/2005 | Schaper | G03F 7/091 438/758 |
| 7,125,510 B2 * | 10/2006 | Huang | B29C 39/10 264/225 |
| 7,811,486 B2 * | 10/2010 | Karim | A61C 5/77 264/17 |
| 8,382,466 B2 * | 2/2013 | Hubert | G03F 7/0002 264/293 |
| 8,940,117 B2 * | 1/2015 | Slafer | C23C 16/44 264/293 |

(Continued)

*Primary Examiner* — Jeffrey M Wollschlager
*Assistant Examiner* — Xue H Liu
(74) *Attorney, Agent, or Firm* — Locke Lord LLP; Tim Tingkang Xia, Esq.

(57) ABSTRACT

The present invention provides an imprinting method, which includes the steps of: adding a soluble material to a master mold; solidifying the soluble material to form a soluble mold having a mold pattern; adhering a taking device to the soluble mold to separate the soluble mold from the master mold; placing the soluble mold on a polymer layer of a workpiece for imprint; applying a high temperature and a pressure to the soluble mold to allow the polymer layer having an imprint pattern corresponding to the mold pattern and being solidified, and to remove the taking device from the soluble mold; and providing a solvent to dissolve the soluble mold to obtain an imprint workpiece having the imprint pattern.

10 Claims, 17 Drawing Sheets

(56) References Cited

U.S. PATENT DOCUMENTS

| | | | |
|---|---|---|---|
| 2005/0287319 A1* | 12/2005 | Miyazawa | C04B 35/63 |
| | | | 428/34.1 |
| 2006/0249886 A1* | 11/2006 | Chao | B82Y 40/00 |
| | | | 264/293 |
| 2010/0323184 A1* | 12/2010 | Toyota | G02B 3/0056 |
| | | | 264/219 |
| 2014/0188041 A1* | 7/2014 | Moore | B29C 41/36 |
| | | | 264/309 |
| 2015/0297878 A1* | 10/2015 | Singh | A61K 9/0021 |
| | | | 264/334 |

\* cited by examiner

IMPRINTING METHOD USING A SOLVENT TO REMOVE A MOLD AND THE RELATED IMPRINTING SYSTEM

CROSS REFERENCE

This non-provisional application is a Continuation-in-Part of American non-provisional application Ser. No. 16/738,201, filed on Jan. 9, 2020, the contents thereof are incorporated by reference herein.

FIELD OF THE INVENTION

The present invention is related to an imprinting method, and particularly to an imprinting method using a solvent to remove a mold and the related imprinting system.

BACKGROUND OF THE INVENTION

In an electronic product, e.g. a display device or an illuminating lamp, an optical element controls optical property including light reflection or light diffraction through nanoscale-to-microscale fine structures. Fine structures can be formed through photolithography, electron beam lithography, imprint, or molecular transfer lithography.

The so-called "imprint" is performed by transferring a mold having a specific pattern onto an article to form a fine structure corresponding to the specific pattern on the article. Removing the mold from the article is a process called "mold release." Based on the good adherence between the mold and the article, a part of the mold remains on the article after mold release. This not only can increase the mold damage rate, but also make the fine structure defective. American Patent U.S. Pat. No. 6,849,558B2 and American Patent Publication US2006/0249886A1 both disclose the use of a mold made of water-soluble polyvinyl alcohol (PVA). This water-soluble mold is produced by injecting a soluble material into a master mold to cure and then removing the mold from the master mold using a preform. As described in Journal of Vacuum Science & Technology B 21, 2961 (2003), the preform is made of the same material as the soluble material, and it must be attached to the soluble material before the soluble material is completely cured. Generally, the concentration and the thickness of the soluble material can affect the curing time, and therefore it depends on the operator's expertise and experience at what curing extent the preform is attached to the soluble material.

The so-called "molecular transfer lithography" is performed by placing a mold filled with a photoresist material in its holes onto an article, and then forming a fine structure at the position of the article uncovered with the photoresist material through lighting and etching. As described in Nanotechnology 24 (2013) 085302 (6pp), although the mold is soluble, it needs to be evenly distributed on the article using a roller. This leads to the deformation of the later-formed fine structure resulted from the structure space expansion.

SUMMARY OF THE INVENTION

The present invention provides an imprinting method, which includes the steps of: adding a soluble material to a master mold; solidifying the soluble material to form a soluble mold having a mold pattern; adhering a taking device to the soluble mold to separate the soluble mold from the master mold; placing the soluble mold onto a polymer layer of a workpiece for imprint; applying a high temperature and a pressure to the soluble mold to allow the polymer layer having an imprint pattern corresponding to the mold pattern and being solidified, and to remove the taking device from the soluble mold; and providing a solvent to dissolve the soluble mold to obtain an imprint workpiece having the imprint pattern.

The present invention additionally provides an imprinting method, which includes the steps of: adding a soluble material to a master mold; solidifying the soluble material to form a soluble mold having a mold pattern; adhering a taking device to the soluble mold to separate the soluble mold from the master mold; placing the soluble mold on a polymer layer of a workpiece for imprint; applying a first temperature and a pressure to the soluble mold to allow the polymer layer having an imprint pattern corresponding to the mold pattern and to remove the taking device from the soluble mold; applying a second temperature to the soluble mold, the second temperature being higher than the first temperature, to allow the polymer layer being solidified; and providing a solvent to dissolve the soluble mold to obtain an imprint workpiece having the imprint pattern.

Preferably, the separating step of the soluble mold from the master mold includes the steps of: providing the taking device, the taking device including a ring frame and a tape, the ring frame having a support part and an operating part connected to the support part; surrounding the soluble mold with the ring frame; adhering the tape to the soluble mold to attach a protrusion part of the tape to the support part of the ring frame; and operating the operating part of the ring frame to remove the soluble mold from the master mold.

Preferably, the separating step of the soluble mold from the master mold includes the steps of: providing the taking device, the taking device including a ring frame, a tape, and a support plate, the ring frame having a support part and an operating part connected to the support part; adhering the support plate to the soluble mold; surrounding the support plate with the ring frame; adhering the tape to the support plate to attach a protrusion part of the tape to the support part of the ring frame; and operating the operating part of the ring frame to remove the soluble mold from the master mold.

Preferably, the separating step of the soluble mold from the master mold includes the steps of: providing the taking device, the taking device including a ring frame, a tape, and a support plate, the tape connected to a side of the ring frame, the support plate connected to a side of the tape facing the ring frame; adhering the tape to the soluble mold to attach the taking device to the soluble mold; and operating the ring frame to remove the soluble mold from the master mold.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the substrate layer having a second alignment mark; determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the substrate layer having a second alignment mark; contacting the soluble mold with the polymer layer; and determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the substrate layer having a second alignment mark; moving a camera to a position between the soluble mold and the workpiece for imprint to determine whether the first alignment mark and the second alignment mark are aligned with each other; and if the two alignment marks are aligned with each other, restoring the position of the camera and contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the working platform having a third alignment mark; determining whether the first alignment mark and the third alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the working platform having a third alignment mark; contacting the soluble mold with the polymer layer; and determining whether the first alignment mark and the third alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the polymer layer having a fourth alignment mark; determining whether the first alignment mark and the fourth alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the polymer layer having a fourth alignment mark; contacting the soluble mold with the polymer layer; and determining whether the first alignment mark and the fourth alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the soluble mold has a first alignment mark, and the placing step of the soluble mold onto the polymer layer includes the steps of: depositing the workpiece for imprint on a working platform, the workpiece for imprint having a substrate layer positioned between the polymer layer and the working platform, the polymer layer having a fourth alignment mark; moving a camera to a position between the soluble mold and the workpiece for imprint to determine whether the first alignment mark and the fourth alignment mark are aligned with each other; and if the two alignment marks are aligned with each other, restoring the position of the camera and contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

Preferably, the tape is made of a heat-dissociable foam and a UV-dissociable foam.

Preferably, the applying step of the high temperature (or the first temperature) and the pressure to the soluble mold includes the steps of: applying a positive pressure to a surface of the soluble mold opposite to the polymer layer;

and/or applying a negative pressure to another surface of the soluble mold facing the polymer layer.

Preferably, the soluble material is polyvinyl alcohol (PVA) and the solvent is water.

According to the present invention, after complete solidification of the soluble material to form the soluble mold, the taking device is adhered to the soluble mold, which leads to the convenience of taking the soluble mold out of the master mold. As such, the operation prevalence increases. By various aligning means, the soluble mold can be accurately positioned onto the polymer layer so that the imprint pattern can be accurately formed on the predetermined position of the polymer layer. Accordingly, while the imprint workpiece is used as an optical element, it can provide accurate and good optical property. Especially while the alignment marks are formed on the soluble mold and the working platform, there is no interference of alignment marks with the optical property of an optical element, which results from that no alignment mark is formed on the imprint workpiece. Additionally, by various deposition positions of the camera, each method of the present invention can be adopted in various types of devices. Especially, while the camera is positioned at the side of the working platform opposite to the workpiece for imprint, the liquid or the volatile gas produced from the soluble-mold dissolution can't contaminate the camera by using the working platform as a barrier. As such, there is no need to clean the camera for the next imprint. Especially while the position of the camera is restored after the alignment marks are aligned with each other, the liquid or the volatile gas produced from the soluble-mold dissolution can't contaminate the camera. As such, there is no need to clean the camera for the next imprint.

Within the scope of the present invention, an imprinting system is also provided, and the system includes: a working platform and a camera. The working platform is configured for a workpiece for imprint, a soluble mold, and a taking device being deposited thereon, the workpiece for imprint has a substrate layer and a polymer layer positioned on the substrate layer, the soluble mold is positioned on the polymer layer of the workpiece for imprint and has a mold pattern and a first alignment mark, and the taking device is adhered to the soluble mold; wherein the substrate layer has a second alignment mark, the working platform has a third alignment mark, or the polymer layer has a fourth alignment mark. The camera is configured for determining whether the first alignment mark and the second alignment mark are aligned with each other, the first alignment mark and the third alignment mark are aligned with each other, or the first alignment mark and the fourth alignment mark are aligned with each other.

Preferably, the imprinting system further includes: an imprint element, and the imprint element is configured for applying a high temperature and a pressure to the soluble mold to allow the polymer layer having an imprint pattern corresponding to the mold pattern and being solidified, and to remove the taking device from the soluble mold.

Preferably, the imprinting system additionally includes: an imprint element, and the imprint element is configured for applying a first temperature and a pressure to the soluble mold to allow the polymer layer having an imprint pattern corresponding to the mold pattern and to remove the taking device from the soluble mold, and then applying a second temperature to the soluble mold, the second temperature being higher than the first temperature, to allow the polymer layer being solidified.

Preferably, the imprinting system further includes: a position-adjusting element, and the position-adjusting element is configured for, while the first alignment mark and the second alignment mark are not aligned with each other, the first alignment mark and the third alignment mark are not aligned with each other, or the first alignment mark and the fourth alignment mark are not aligned with each other, adjusting an x-axis position and a y-axis position of the soluble mold and a θ angle formed between the soluble mold and an x-y plane defined by the working platform until the first alignment mark and the second alignment mark are aligned with each other, the first alignment mark and the third alignment mark are aligned with each other, or the first alignment mark and the fourth alignment mark are aligned with each other.

Preferably, the imprinting system additionally includes: a dissolving element, and the dissolving element is configured for providing a solvent to dissolve the soluble mold to obtain an imprint workpiece having the imprint pattern.

Preferably, the imprinting system further includes: an infrared (IR) emitter, and the infrared emitter is configured for emitting an infrared ray to the first alignment mark and the second alignment mark, the first alignment mark and the third alignment mark, or the first alignment mark and the fourth alignment mark.

Preferably, the camera is positioned at a side of the taking device opposite to the soluble mold or positioned at a side of the working platform opposite to the workpiece for imprint.

Preferably, the camera is moveable to a position between the soluble mold and the workpiece for imprint.

DETAILED DESCRIPTION OF THE INVENTION

The detailed description and preferred embodiments of the invention will be set forth in the following content, and provided for people skilled in the art to understand the characteristics of the invention.

Figure 1:
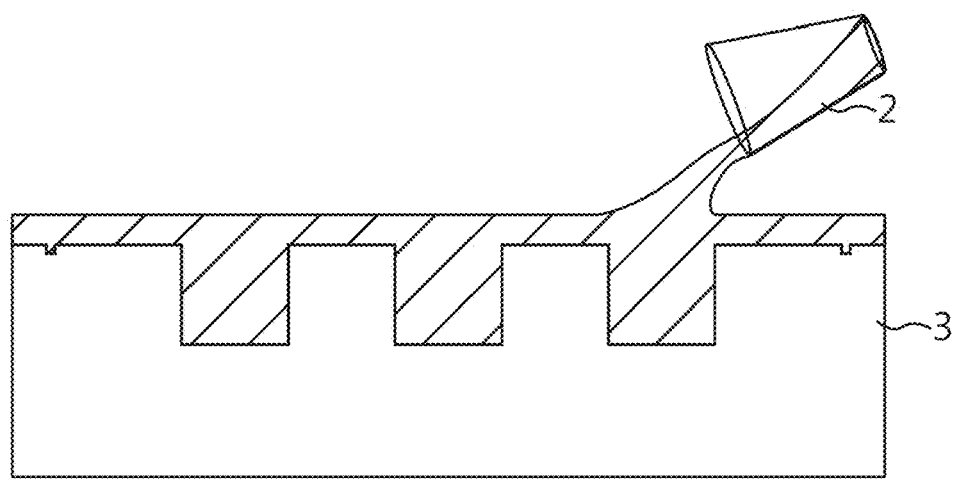
FIGS. 1-7 are a series of schematic views illustrating an imprinting method according to an embodiment of the present invention.
Figure 2:
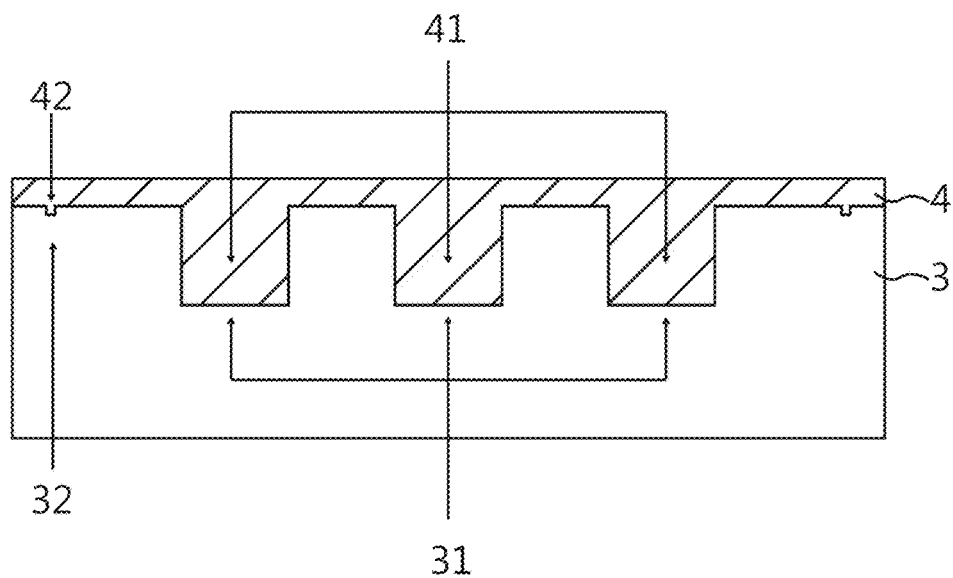
Figure 8:
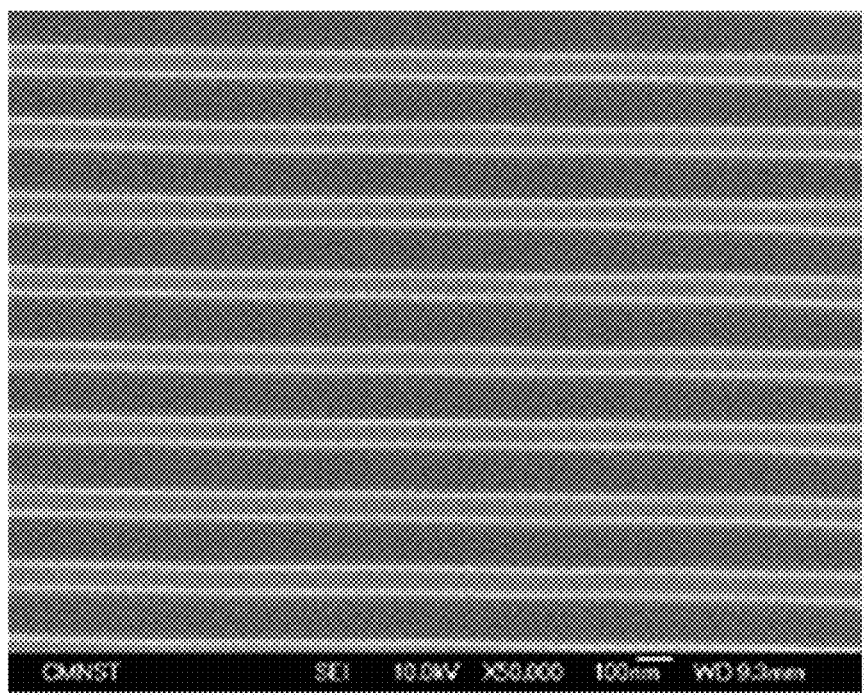
FIG. 8 is a scanning electron microscopic (SEM) picture showing the top view of an imprint workpiece having the imprint pattern.
Figure 9:
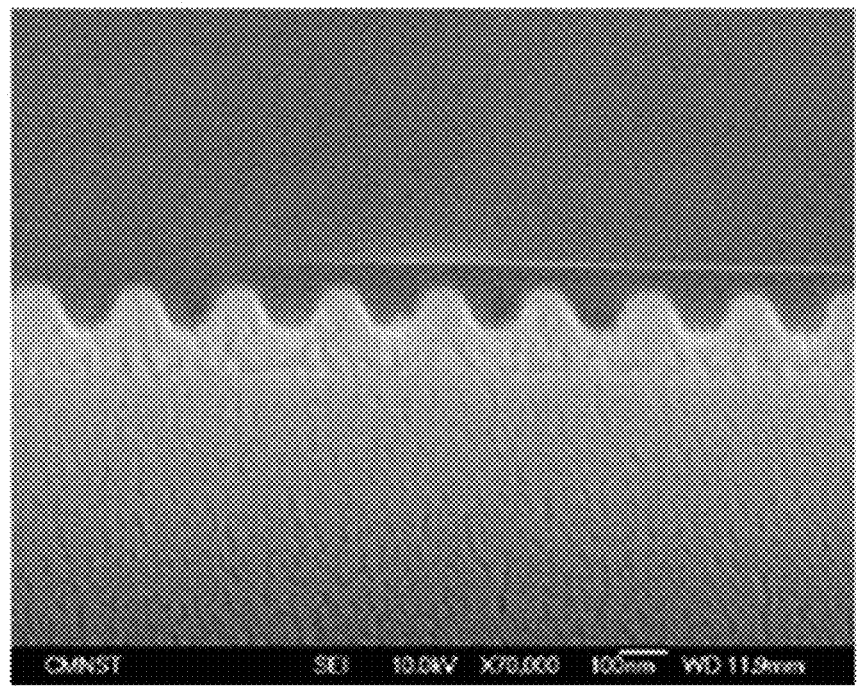
FIG. 9 is a scanning electron microscopic (SEM) picture showing the side view of the foregoing imprint workpiece.

As shown in FIGS. 1-7, an imprinting method according to an embodiment of the present invention is illustrated, wherein the obtained imprint workpiece (1) has an imprint pattern (11). As shown in FIGS. 8 and 9, the imprint pattern (11) is not only clearly formed on the imprint workpiece (1), but also has a profile without structure defects. The detailed steps of the exemplary method are described as below:

Firstly, as shown in FIGS. 1 and 2, a soluble material (2) is added to a master mold (3), the master mold (3) having a mold structure (31) and a mark structure (32). Then, the soluble material (2) is solidified to form a soluble mold (4), the soluble mold (4) having a mold pattern (41) corresponding to the mold structure (31) and a first alignment mark (42) corresponding to the mark structure (32). Preferably, the soluble material (2) is polyvinyl alcohol and its thickness on the master mold (3) is from 10 μm to 1,000 μm. Accordingly, the latterly-obtained soluble mold (4) is not only soluble, but also flexible. The soluble material (2) may be added to the master mold (3) in a solution form, and its concentration in the solution may be from 5 wt % to 50 wt %, but not limited thereto. In case that its concentration is lower than the low limit, the probability for the mold pattern (41) incompleteness may increase so that the mold pattern (41) is defective to lower the imprinting quality. The soluble material (2) may be added to the master mold (3) through spin coating or slot-die coating, and the spin rate for spin coating may be from 100 rpm to 5,000 rpm, but not limited thereto. Preferably, the master mold (3) is made of silicon. The "solidifying" used in the context may be heat-solidifying or photo-solidifying (e.g. UV-solidifying); the temperature for heat-solidifying may be from room temperature to 160° C. and the duration therefor may be from 5 minutes to 60 minutes, but not limited thereto. In case that the duration is higher than the upper limit, the peeling difficulty for the soluble mold (4) may increase so that the mold pattern (41) is formed with defects.

Figure 3A:
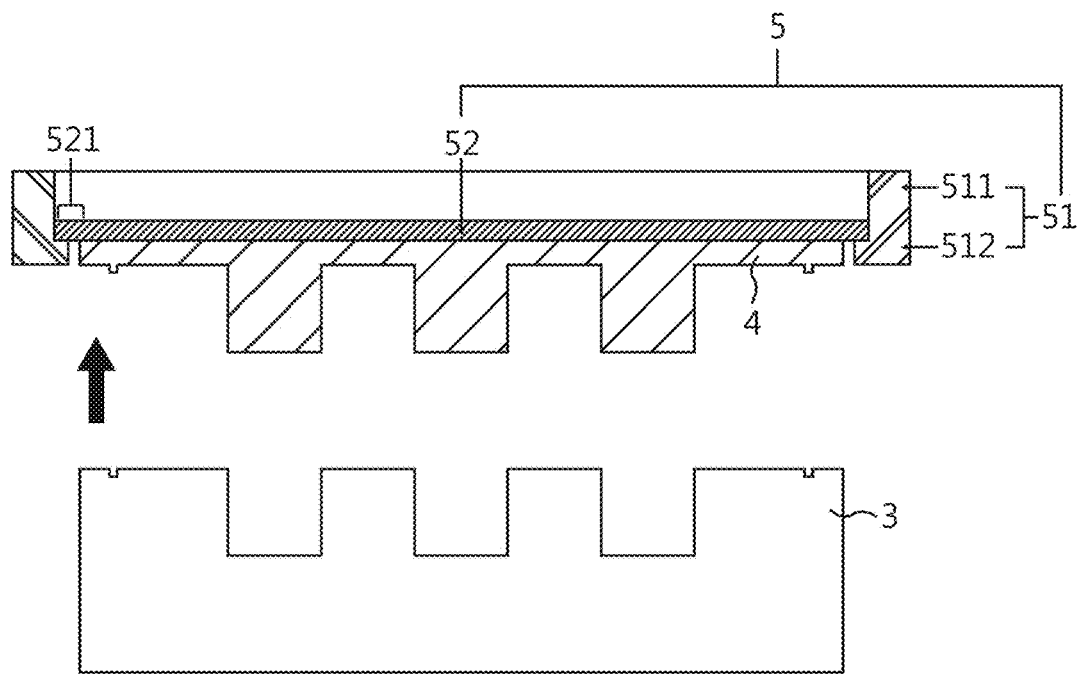
Figure 3B:
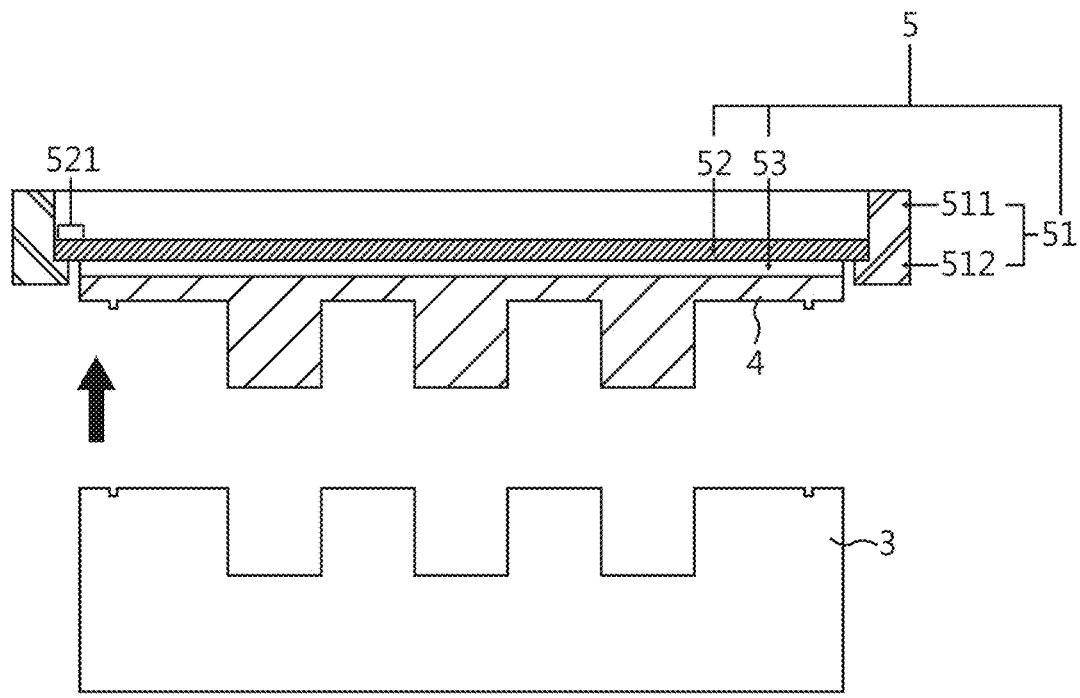
Figure 3C:
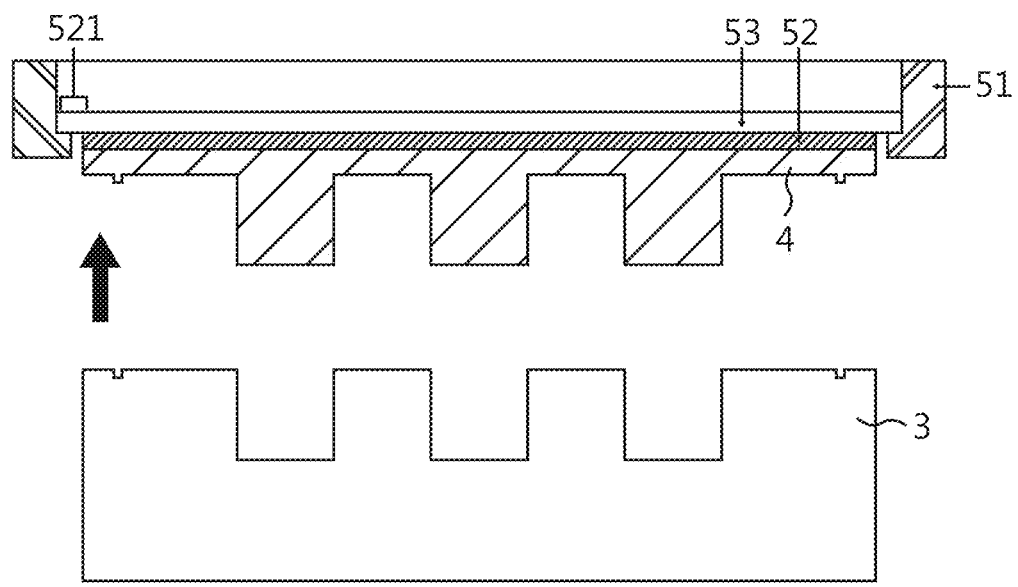

Secondly, as shown in any one of FIGS. 3A-3C, a taking device (5) is adhered to the soluble mold (4) to separate the soluble mold (4) from the master mold (3). In the example shown in FIG. 3A, the taking device (5) is provided, the taking device (5) having a ring frame (51) and a tape (52), the ring frame (51) having a support part (511) and an operating part (512) connected to the support part (511). Then, the soluble mold (4) is surrounded with the ring frame (51). Afterwards, the tape (52) is adhered to the soluble mold (4) to attach a protrusion part (521) of the tape (52) to the support part (511) of the ring frame (51). Finally, the operating part (512) of the ring frame (51) is operated to remove the soluble mold (4) from the master mold (3). Additionally, the tape (52) may be made of a heat-dissociable foam or a UV-dissociable foam, but not limited thereto. Preferably, the heat-dissociable foam is a polystyrene (PS) foam or a polyurethane (PU) foam, and its thickness is from 100 μm to 1,000 μm. For conveniently peeling the soluble mold (4) to make the mold pattern (41) complete, the area of the tape (52) is preferably greater than that of the soluble mold (4) and the protrusion part (521) of the tape (52) is formed at two ends of the tape (52) so that the soluble mold (4) is peeled with the tape (52) completely adhered to the soluble mold (4). Moreover, when the soluble mold (4) is removed from the master mold (3), a vertical peeling force or a sideways peeling force may be applied to the operating part (512) of the ring frame (51).

In the example shown in FIG. 3B, the taking device (5) is provided, the taking device (5) having a ring frame (51), a tape (52), and a support plate (53), the ring frame (51) having a support part (511) and an operating part (512) connected to the support part (511). Then, the support plate (53) is adhered to the soluble mold (4). Afterwards, the support plate (53) is surrounded with the ring frame (51). After which, the tape (52) is adhered to the support plate (53) to attach a protrusion part (521) of the tape (52) to the support part (511) of the ring frame (51). Finally, the operating part (512) of the ring frame (51) is operated to remove the soluble mold (4) from the master mold (3). Preferably, the support plate (53) is made of glass. It is noted that the support plate (53) is such designed that the soluble mold (4) can be prevented from deformation resulted from extension during the removal of the soluble mold (4) from the mast mold (3). Except for the above differences, the example described herein has the same operation details and the same technical functions as the example shown in FIG. 3A, and therefore there is no need for further description thereon.

In the example shown in FIG. 3C, the taking device (5) is provided, the taking device (5) including a ring frame (51), a tape (52), and a support plate (53), the tape (52) connected to a side of the ring frame (51), the support plate (53) connected to a side of the tape (52) facing the ring frame (51). Then, the tape (52) is adhered to the soluble mold (4) to attach the taking device (5) to the soluble mold (4). Finally, the ring frame (51) is operated to remove the soluble mold (4) from the master mold (3). Preferably, the support plate (53) is made of glass. It is noted that the support plate (53) is such designed that the tape (52) can be supported to prevent the soluble mold (4) from deformation resulted from extension during the removal of the soluble mold (4) from the mast mold (3). For lowering the probability for the soluble mold (4) deformation resulted from extension during the removal of the soluble mold (4) from the mast mold (3), the contact area between the support plate (53) and the tape (52) is at least equivalent to that between the soluble mold (4) and the tape (52). Except for the above differences, the example described herein has the same operation details and the same technical functions as the example shown in FIG. 3A, and therefore there is no need for further description thereon.

Figure 4A:
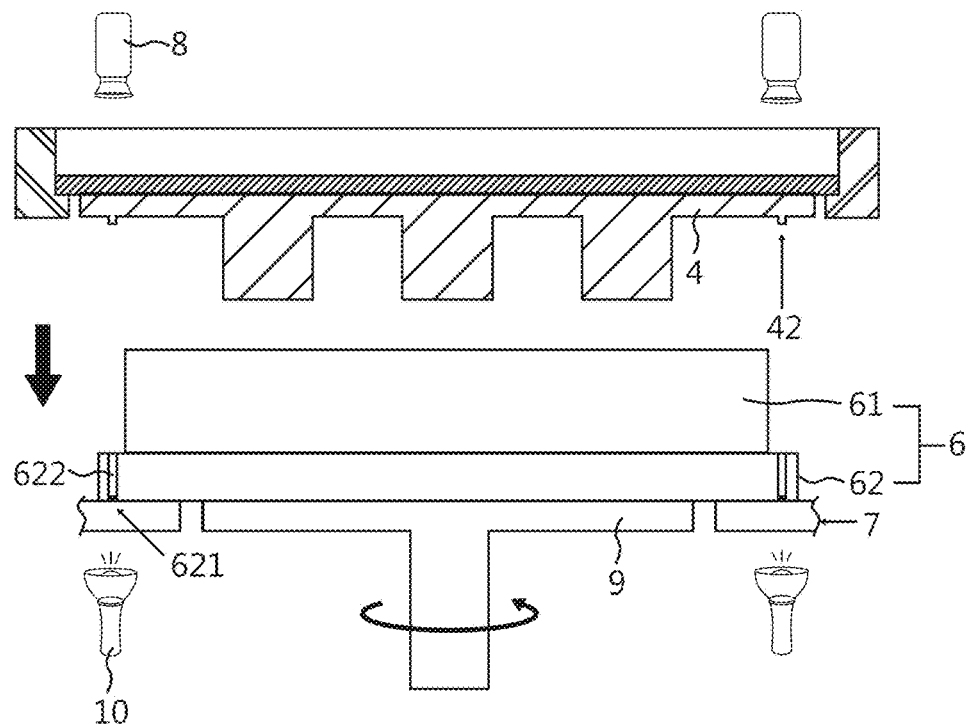
Figure 4B:
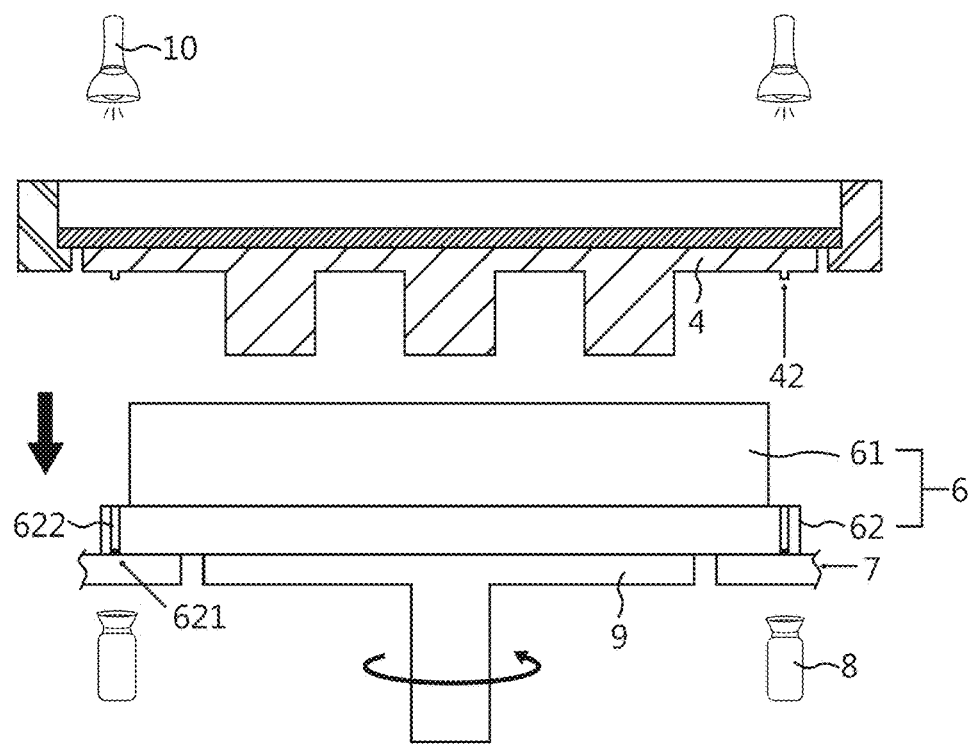
Figure 4C:
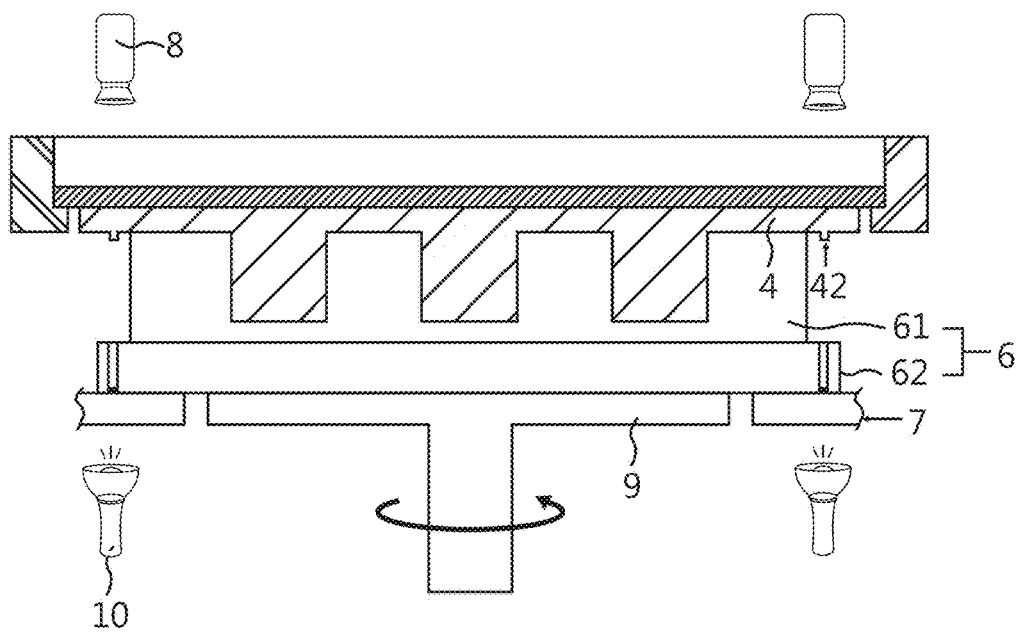
Figure 4D:
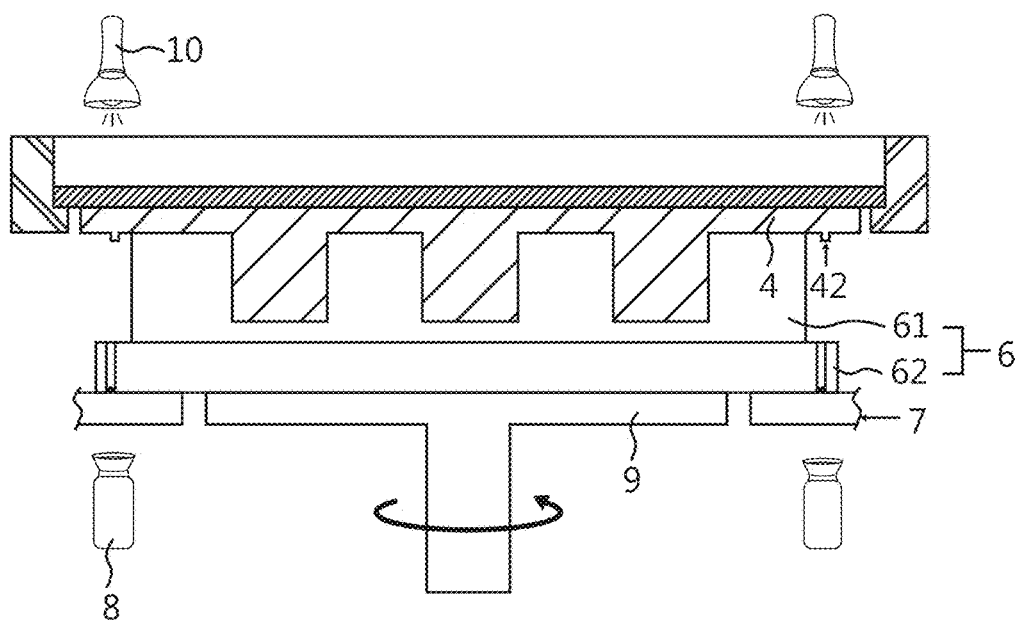
Figure 4E:
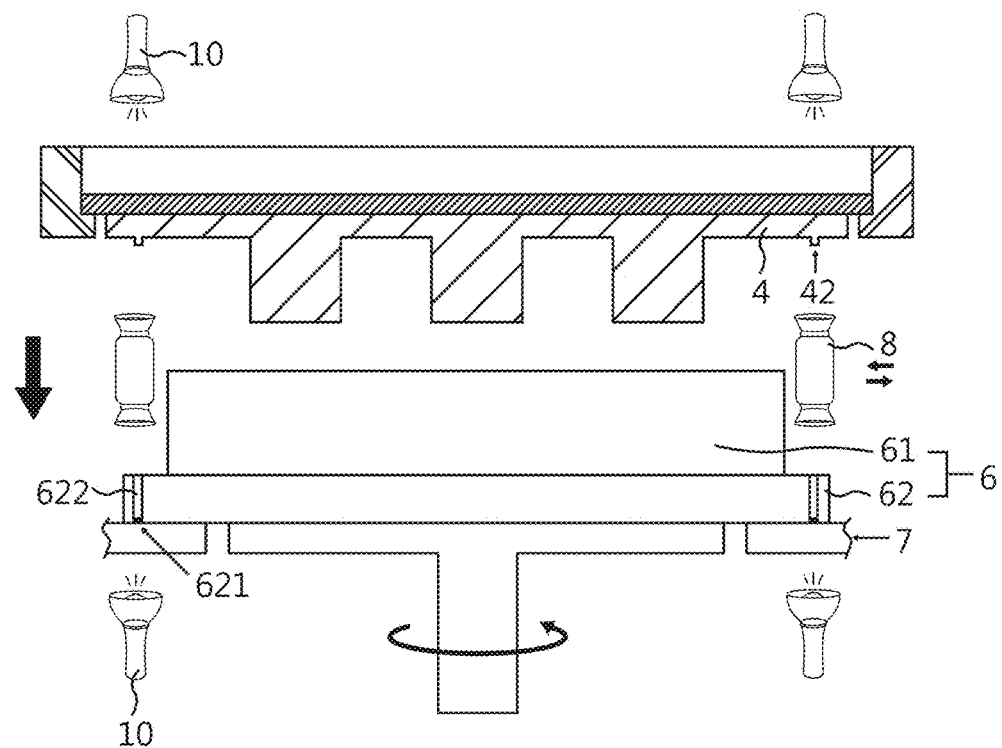
Figure 4F:
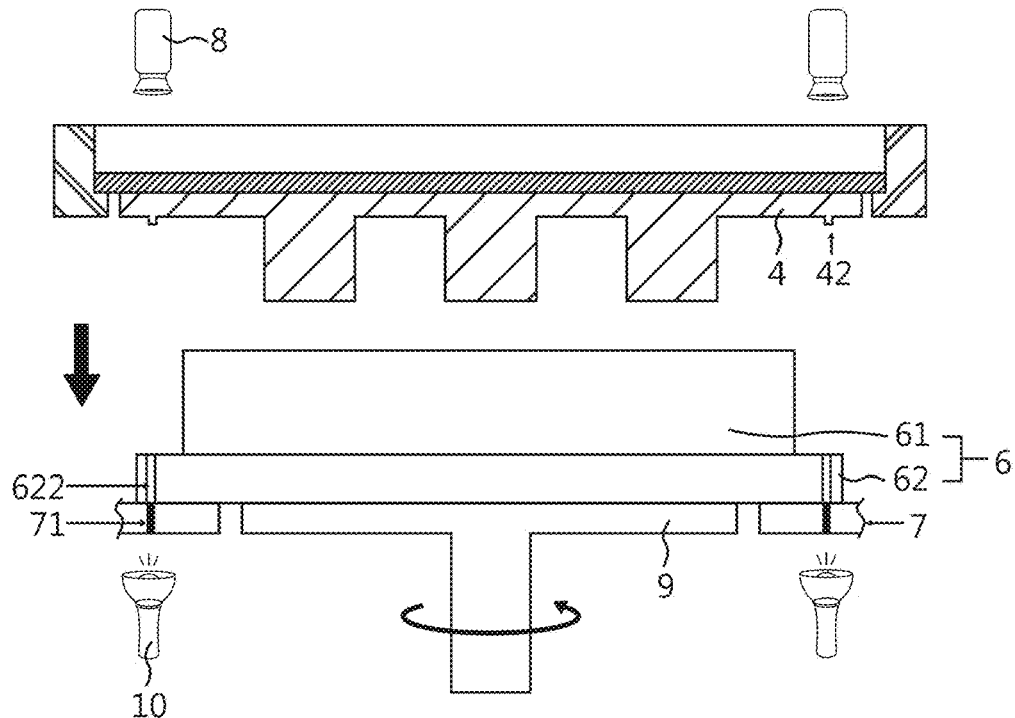
Figure 4G:
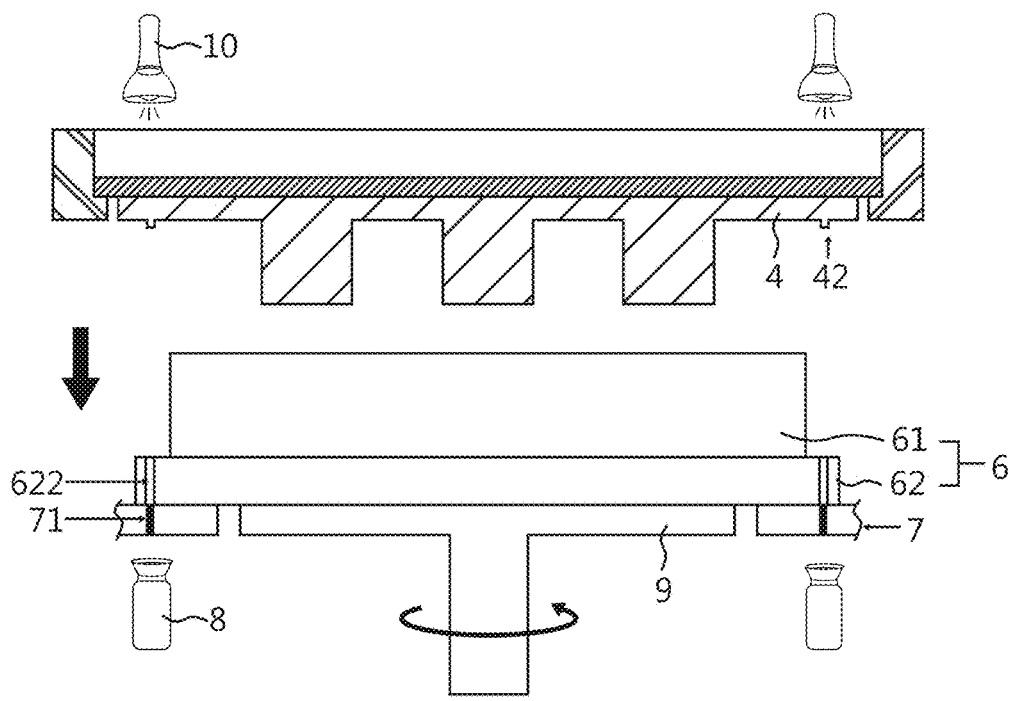
Figure 4H:
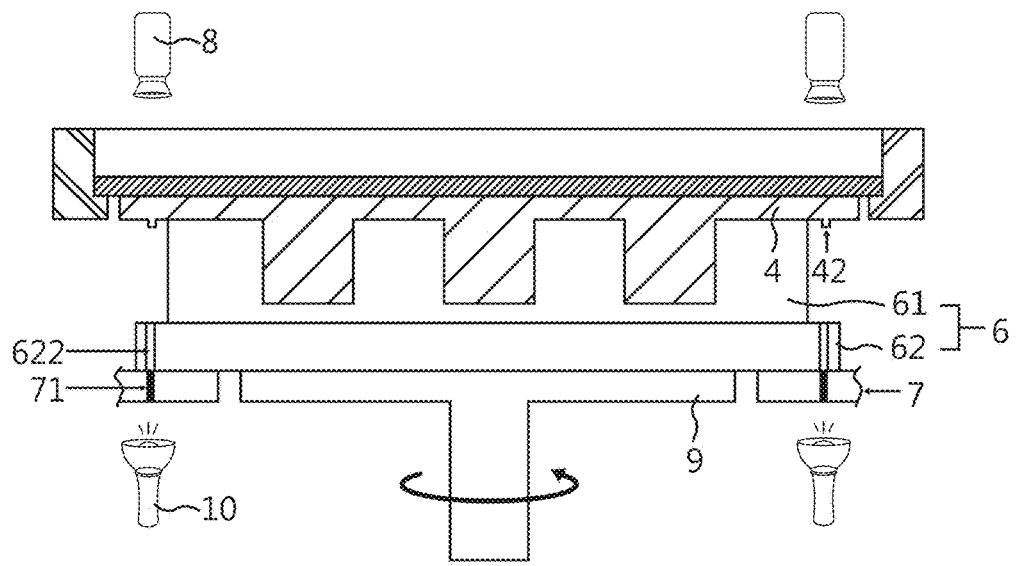
Figure 4I:
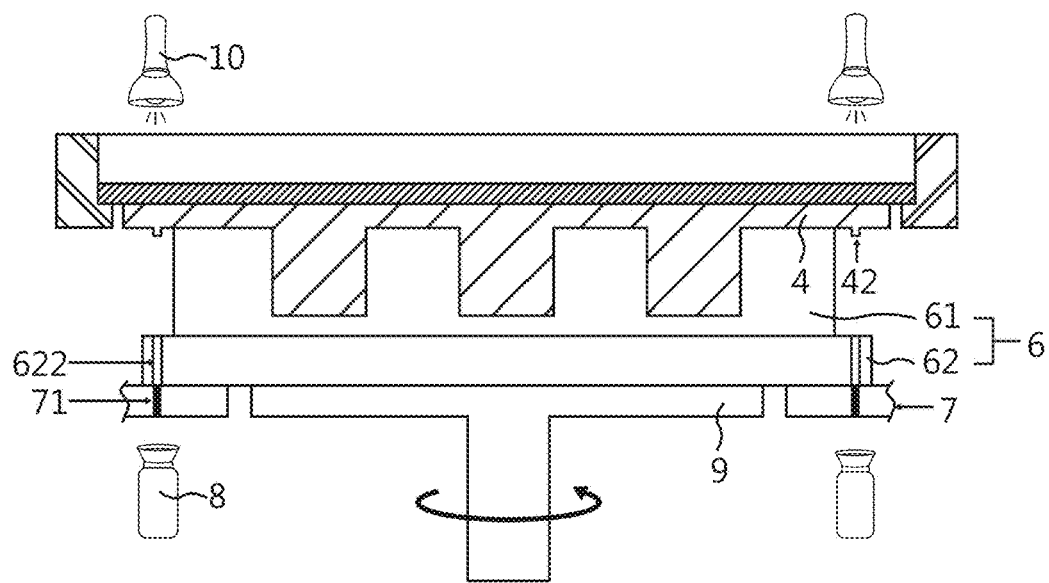
Figure 4J:
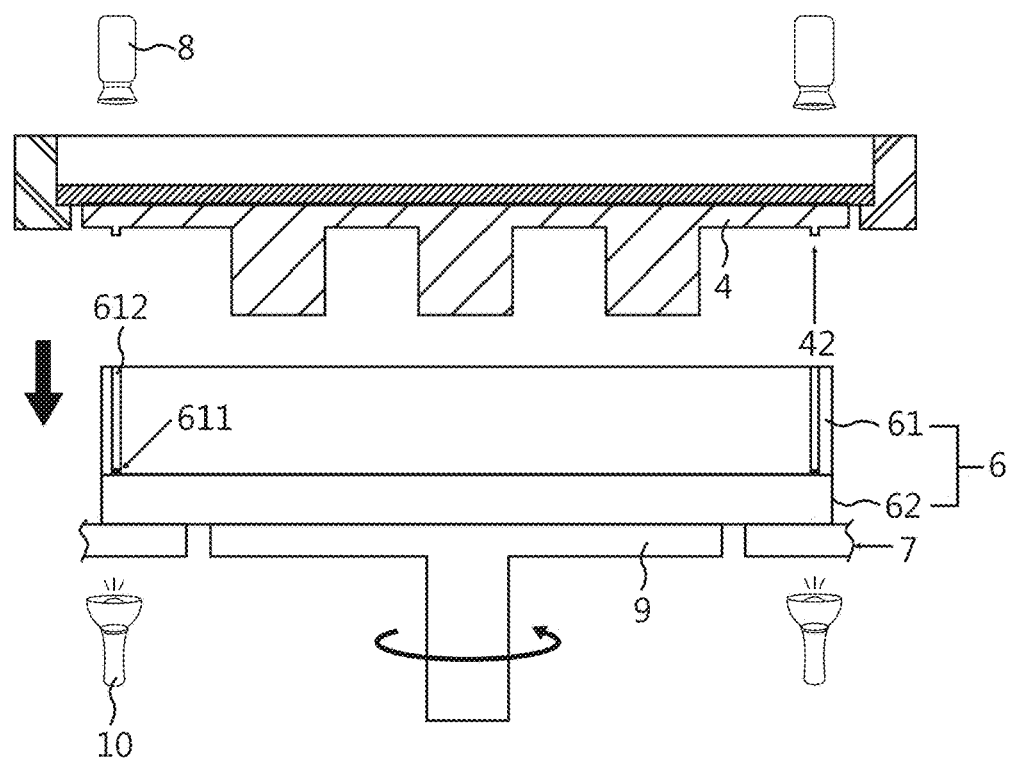
Figure 4K:
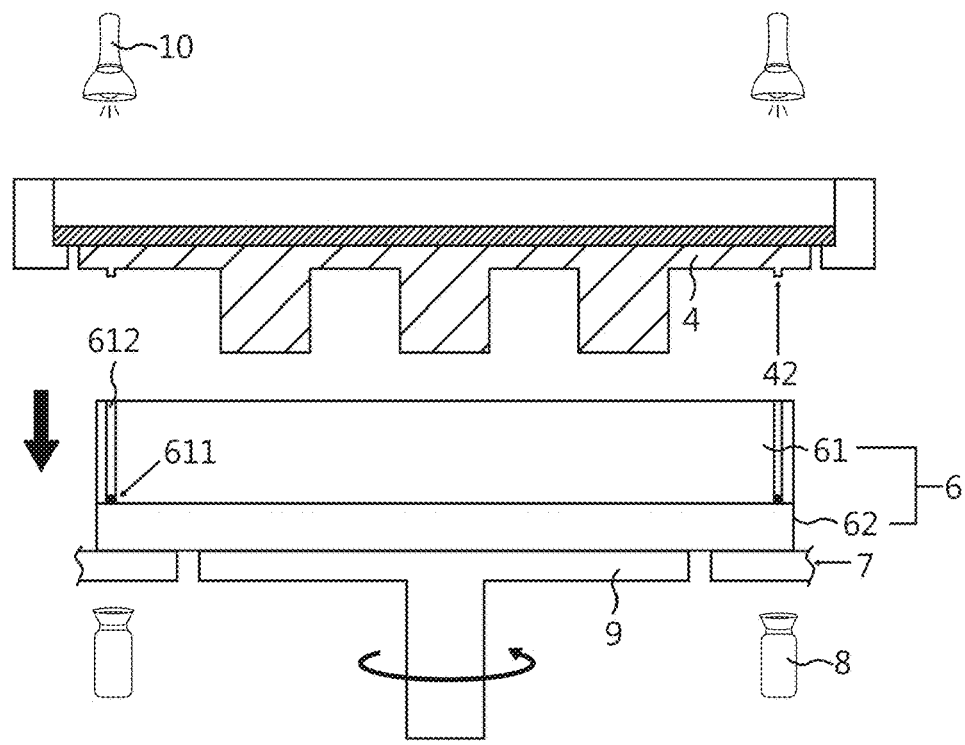
Figure 4L:
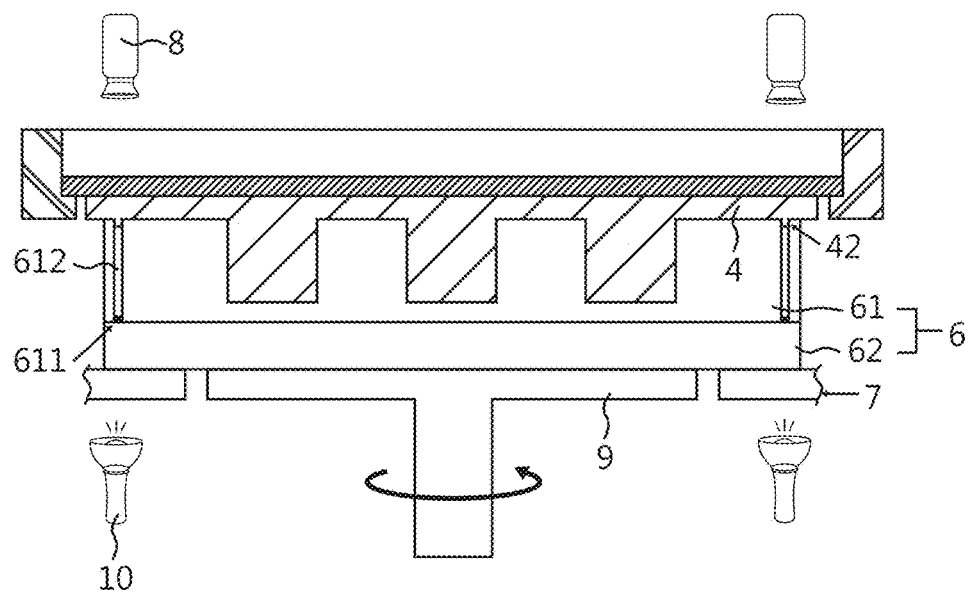
Figure 4M:
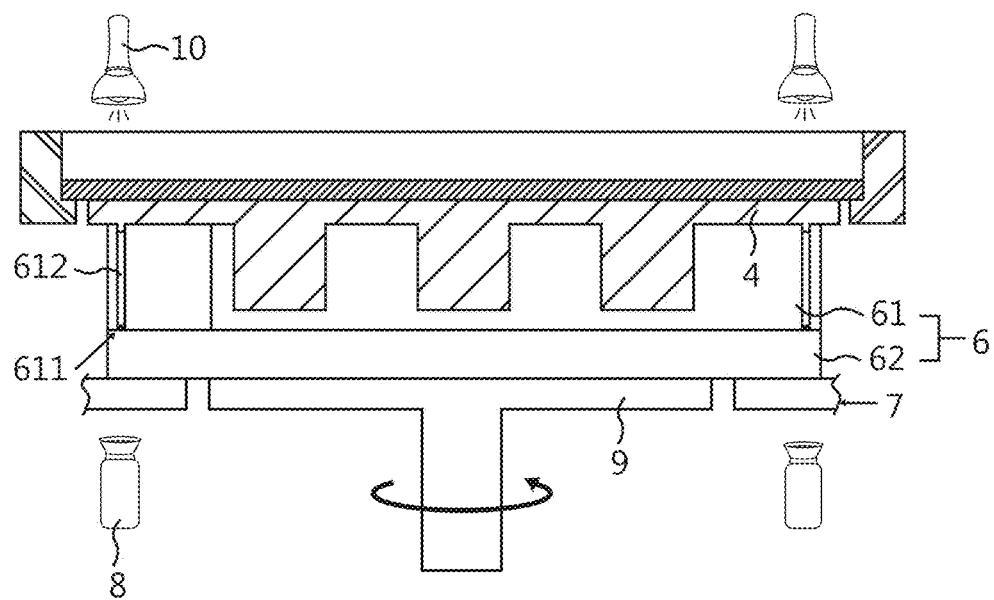
Figure 4N:
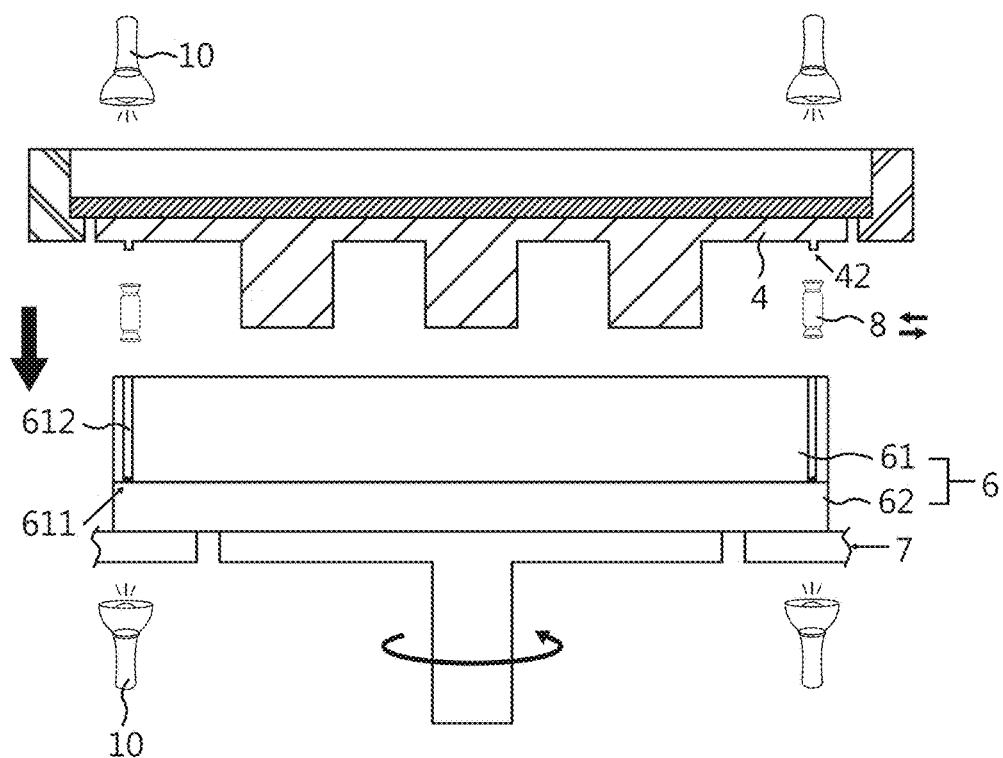

Thirdly, as shown in any one of FIGS. 4A-4N, the soluble mold (4) is placed onto a polymer layer (61) of a workpiece (6) for imprint. In the example shown in FIG. 4A or 4B, a substrate layer (62) of the workpiece (6) for imprint is deposited on a working platform (7), the substrate layer (62) having a second alignment mark (621). Then, the polymer layer (61) is formed on the substrate layer (62). After which, it is determined whether the first alignment mark (42) of the soluble mold (4) and the second alignment mark (621) of the substrate layer (62) are aligned with each other by using a camera (8) positioned at a side of the taking device (5) opposite to the soluble mold (4) or another camera (8) positioned at a side of the working platform (7) opposite to the workpiece (6) for imprint. Finally, if the two alignment marks (42 and 621) are aligned with each other, the soluble mold (4) is contacted with the polymer layer (61) and the subsequent step is performed; if the two alignment marks (42 and 621) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 621) are aligned with each other. Furthermore, the polymer layer (61) may be formed by coating a polymer material having a glass transition temperature (Tg) lower than that of the soluble mold (4) with spinning onto the substrate layer (62), or by coating a polymer material having a glass transition temperature lower than that of the soluble mold (4) with spinning onto the substrate layer (62) and then baking the polymer material. Preferably, the glass transition temperature of the polymer material is from 20° C. to 150° C., the spinning rate is from 1,000 rpm to 5,000 rpm, and the spinning thickness is from 0.05 μm to 1,000 μm. It is noted that it is determined whether the baking is performed according to the polymer material properties. Preferably, the baking temperature is from 80° C. to 150° C. and the baking duration is from 3 minutes to 5 minutes. Besides spin-coating, the polymer layer (61) may be formed onto the substrate layer (62) with affixing by using an affixing element (not shown). Although FIGS. 4A and 4B depict that the second alignment mark (621) of the substrate layer (62) is positioned on a surface of the substrate layer (62) opposite to the soluble mold (4), it may be positioned on another surface of the substrate layer (62) opposite to the working platform (7). While the second alignment mark (621) of the substrate layer (62) is positioned on a surface of the substrate layer (62) opposite to the soluble mold (4), the substrate layer (62) may interfere with an image of the first alignment mark (42) and the second alignment mark (621) captured by the camera (8). Therefore, a via hole (622) may be formed on the substrate layer (62) to expose the second alignment mark (621). Moreover, for conveniently capturing the image of the first alignment mark (42) and the second alignment mark (621), the substrate layer (62) is preferably a transparent substrate layer. Additionally, for avoiding the insufficient image definition of the first alignment mark (42) and the second alignment mark (621) resulted from light reflection noise, an infrared emitter (10) is used for emitting the first alignment mark (42) and the second alignment mark (621). The infrared emitter (10) may be positioned at a side of the taking device (5) opposite to the soluble mold (4) or positioned at a side of the working platform (7) opposite to the workpiece (6) for imprint, but not limited thereto.

In the example shown in FIG. 4C or 4D, a substrate layer (62) of the workpiece (6) for imprint is deposited on a working platform (7), the substrate layer (62) having a second alignment mark (621). Then, the polymer layer (61) is formed on the substrate layer (62). After which, the soluble mold (4) is contacted with the polymer layer (61). Afterwards, it is determined whether the first alignment mark (42) of the soluble mold (4) and the second alignment mark (621) of the substrate layer (62) are aligned with each other by using a camera (8) positioned at a side of the taking device (5) opposite to the soluble mold (4) or another camera (8) positioned at a side of the working platform (7) opposite to the workpiece (6) for imprint Finally, if the two alignment marks (42 and 621) are aligned with each other, the subsequent step is performed; if the two alignment marks (42 and 621) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 621) are aligned with each other. Except for the above differences, the example described herein has the same operation details and the same technical functions as the example shown in FIG. 4A or 4B, and therefore there is no need for further description thereon.

In the example shown in FIG. 4E, a substrate layer (62) of the workpiece (6) for imprint is deposited on a working platform (7), the substrate layer (62) having a second alignment mark (621). Then, the polymer layer (61) is formed on the substrate layer (62). After which, a camera (8) is moved to a position between the soluble mold (4) and the workpiece (6) for imprint to determine whether the first alignment mark (42) of the soluble mold (4) and the second alignment mark (621) of the substrate layer (62) are aligned with each other. Finally, if the two alignment marks (42 and 621) are aligned with each other, the position of the camera (8) is restored, the soluble mold (4) is contacted with the polymer layer (61), and the subsequent step is performed; if the two alignment marks (42 and 621) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 621) are aligned with each other. Except for the above differences, the example described herein has the same operation details and the same technical functions as the example shown in FIG. 4A or 4B, and therefore there is no need for further description thereon.

In the example shown in FIG. 4F or 4G, a substrate layer (62) of the workpiece (6) for imprint is deposited on a working platform (7), the working platform (7) having a third alignment mark (71). Then, the polymer layer (61) is formed on the substrate layer (62). After which, it is determined whether the first alignment mark (42) of the soluble mold (4) and the third alignment mark (71) of the working platform (7) are aligned with each other by using a camera (8) positioned at a side of the taking device (5) opposite to the soluble mold (4) or another camera (8) positioned at a side of the working platform (7) opposite to the workpiece (6) for imprint. Finally, if the two alignment marks (42 and 71) are aligned with each other, the soluble mold (4) is contacted with the polymer layer (61) and the subsequent step is performed; if the two alignment marks (42 and 71) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 71) are aligned with each other. Furthermore, the polymer layer (61) may be formed by coating a polymer material having a glass transition temperature lower than that of the soluble mold (4) with spinning onto the substrate layer (62), or by coating a polymer material having a glass transition temperature lower than that of the soluble mold (4) with spinning onto the substrate layer (62) and then baking the polymer material. Preferably, the glass transition temperature of the polymer material is from 20° C. to 150° C., the spinning rate is from 1,000 rpm to 5,000 rpm, and the spinning thickness is from 0.05 μm to 1,000 μm. It is noted that it is determined whether the baking is performed according to the polymer material properties. Preferably, the baking temperature is from 80° C. to 150° C. and the baking duration is from 3 minutes to 5 minutes. Besides spin-coating, the polymer layer (61) may be formed onto the substrate layer (62) with affixing by using an affixing element (not shown). Since the substrate layer (62) may interfere with an image of the first alignment mark (42) and the third alignment mark (71) captured by the camera (8), a via hole (622) may be formed on the substrate layer (62) to expose the third alignment mark (71). Moreover, for conveniently capturing the image of the first alignment mark (42) and the third alignment mark (71), the substrate layer (62) is preferably a transparent substrate layer. Additionally, for avoiding the insufficient image definition of the first alignment mark (42) and the third alignment mark (71) resulted from light reflection noise, an infrared emitter (10) is used for emitting the first alignment mark (42) and the third alignment mark (71). The infrared emitter (10) may be positioned at a side of the taking device (5) opposite to the soluble mold (4) or positioned at a side of the working platform (7) opposite to the workpiece (6) for imprint, but not limited thereto.

In the example shown in FIG. 4H or 4I, a substrate layer (62) of the workpiece (6) for imprint is deposited on a working platform (7), the working platform (7) having a third alignment mark (71). Then, the polymer layer (61) is formed on the substrate layer (62). After which, the soluble mold (4) is contacted with the polymer layer (61). Afterwards, it is determined whether the first alignment mark (42) of the soluble mold (4) and the third alignment mark (71) of the working platform (7) are aligned with each other by using a camera (8) positioned at a side of the taking device (5) opposite to the soluble mold (4) or another camera (8) positioned at a side of the working platform (7) opposite to the workpiece (6) for imprint. Finally, if the two alignment marks (42 and 71) are aligned with each other, the subsequent step is performed; if the two alignment marks (42 and 71) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 71) are aligned with each other. Except for the above differences, the example described herein has the same operation details and the same technical functions as the example shown in FIG. 4F or 4G, and therefore there is no need for further description thereon.

In the example shown in FIG. 4J or 4K, a substrate layer (62) of the workpiece (6) for imprint is deposited on a working platform (7). Then, the polymer layer (61) is formed on the substrate layer (62), the polymer layer (61) having a fourth alignment mark (611). After which, it is determined whether the first alignment mark (42) of the soluble mold (4) and the fourth alignment mark (611) of the polymer layer (61) are aligned with each other by using a camera (8) positioned at a side of the taking device (5) opposite to the soluble mold (4) or another camera (8) positioned at a side of the working platform (7) opposite to the workpiece (6) for imprint. Finally, if the two alignment marks (42 and 611) are aligned with each other, the soluble mold (4) is contacted with the polymer layer (61) and the subsequent step is performed; if the two alignment marks (42 and 611) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 611) are aligned with each other. Furthermore, the polymer layer (61) may be formed by coating a polymer material having a glass transition temperature lower than that of the soluble mold (4) with spinning onto the substrate layer (62), or by coating a polymer material having a glass transition temperature lower than that of the soluble mold (4) with spinning onto the substrate layer (62) and then baking the polymer material. Preferably, the glass transition temperature of the polymer material is from 20° C. to 150° C., the spinning rate is from 1,000 rpm to 5,000 rpm, and the spinning thickness is from 0.05 μm to 1,000 μm. It is noted that it is determined whether the baking is performed according to the polymer material properties. Preferably, the baking temperature is from 80° C. to 150° C. and the baking duration is from 3 minutes to 5 minutes. Besides spin-coating, the polymer layer (61) may be formed onto the substrate layer (62) with affixing by using an affixing element (not shown). Although FIGS. 4J and 4K depict that the fourth alignment mark (611) of the polymer layer (61) is positioned on a surface of the polymer layer (61) opposite to the soluble mold (4), it may be positioned on another surface of the polymer layer (61) opposite to the working platform (7). While the fourth alignment mark (611) of the polymer layer (61) is positioned on a surface of the polymer layer (61) opposite to the soluble mold (4), the substrate layer (62) may interfere with an image of the first alignment mark (42) and the fourth alignment mark (611) captured by the camera (8). Therefore, a via hole (612) may be formed on the polymer layer (61) to expose the fourth alignment mark (611). Moreover, for conveniently capturing the image of the first alignment mark (42) and the fourth alignment mark (611) by using the camera (8), the polymer layer (61) is preferably a transparent polymer layer. Additionally, for avoiding the insufficient image definition of the first alignment mark (42) and the fourth alignment mark (611) resulted from light reflection noise, an infrared emitter (10) is used for emitting the first alignment mark (42) and the fourth alignment mark (611). The infrared emitter (10) may be positioned at a side of the taking device (5) opposite to the soluble mold (4) or positioned at a side of the working platform (7) opposite to the workpiece (6) for imprint, but not limited thereto.

In the example shown in FIG. 4L or 4M, a substrate layer (62) of the workpiece (6) for imprint is deposited on a working platform (7). Then, the polymer layer (61) is formed on the substrate layer (62), the polymer layer (61) having a fourth alignment mark (611). After which, the soluble mold (4) is contacted with the polymer layer (61). Afterwards, it is determined whether the first alignment mark (42) of the soluble mold (4) and the fourth alignment mark (611) of the polymer layer (61) are aligned with each other by using a camera (8) positioned at a side of the taking device (5) opposite to the soluble mold (4) or another camera (8) positioned at a side of the working platform (7) opposite to the workpiece (6) for imprint. Finally, if the two alignment marks (42 and 611) are aligned with each other, the subsequent step is performed; if the two alignment marks (42 and 611) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 611) are aligned with each other. Except for the above differences, the example described herein has the same operation details and the same technical functions as the example shown in FIG. 4J or 4K, and therefore there is no need for further description thereon.

In the example shown in FIG. 4N, a substrate layer (62) of the workpiece (6) for imprint is deposited on a working platform (7). Then, the polymer layer (61) is formed on the substrate layer (62), the polymer layer (61) having a fourth alignment mark (611). After which, a camera (8) is moved to a position between the soluble mold (4) and the workpiece (6) for imprint to determine whether the first alignment mark (42) of the soluble mold (4) and the fourth alignment mark (611) of the polymer layer (61) are aligned with each other. Finally, if the two alignment marks (42 and 611) are aligned with each other, the position of the camera (8) is restored, the soluble mold (4) is contacted with the polymer layer (61), and the subsequent step is performed; if the two alignment marks (42 and 611) are not aligned with each other, an x-axis position and a y-axis position of the soluble mold (4) and a θ angle formed between the soluble mold (4) and an x-y plane defined by the working platform (7) are adjusted by using a position-adjusting element (9), until the two alignment marks (42 and 611) are aligned with each other. Except for the above differences, the example described herein has the same operation details and the same technical functions as the example shown in FIG. 4J or 4K, and therefore there is no need for further description thereon.

Figure 5A:
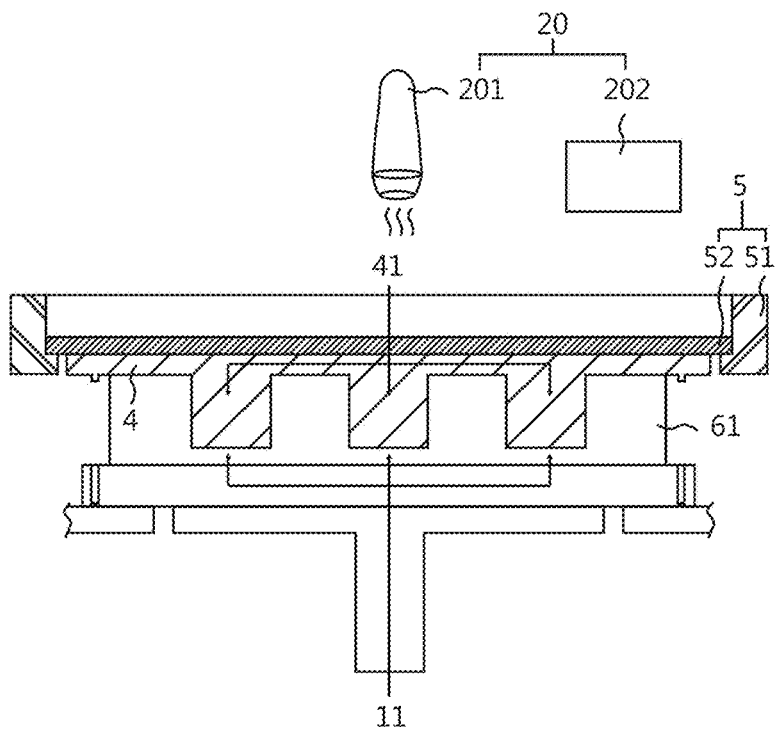
Figure 5B:
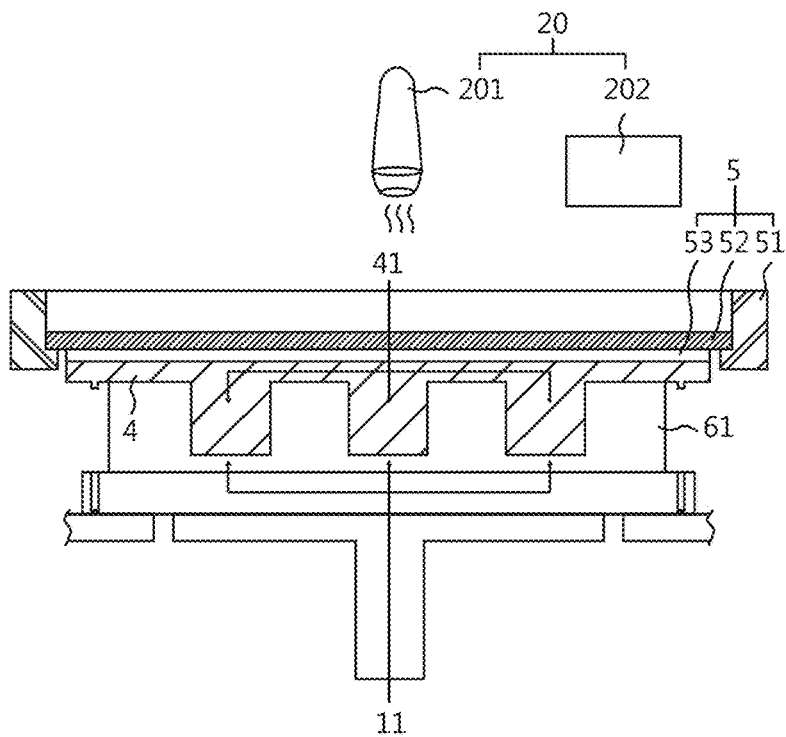
Figure 5C:
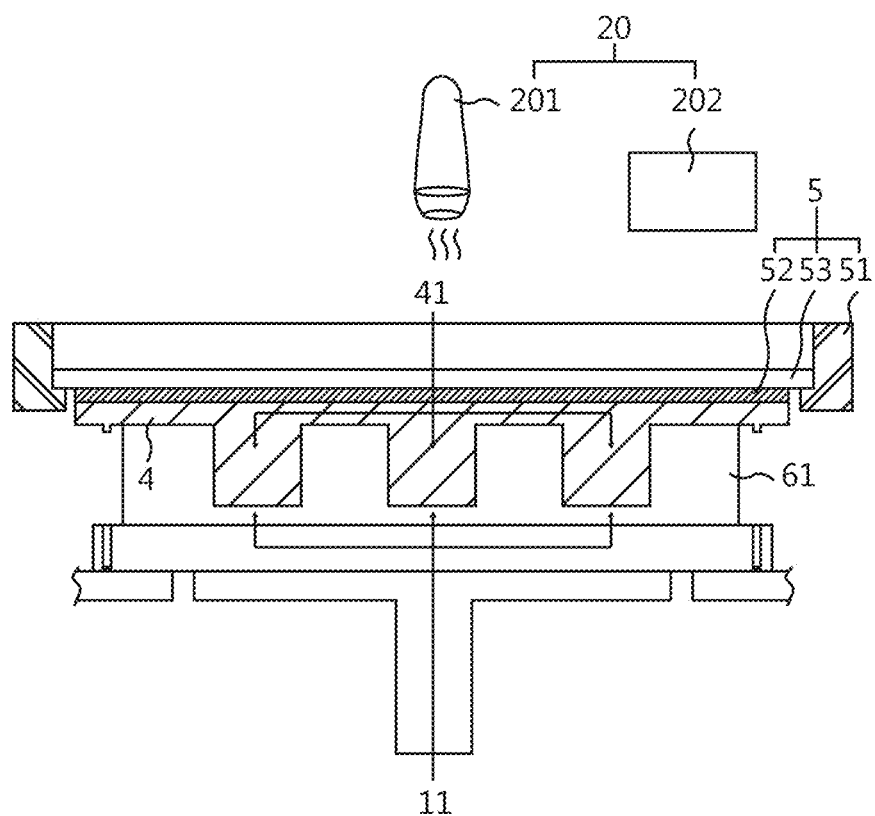

Fourthly, as shown in any one of FIGS. 5A-5C, a high temperature and a pressure are applied to the soluble mold (4) by using an imprint element (20) to allow the polymer layer (61) having an imprint pattern (11) corresponding to the mold pattern (41) and being solidified, and to remove the taking device (5) from the soluble mold (4). In the example shown in FIG. 5A, since the taking device (5) includes the ring frame (51) and the tape (52), the tape (52) is made of a heat-dissociable foam, and the dissociation temperature of the tape (52) (preferably from 80° C. to 150° C.) is lower than the applying high temperature, the applying high temperature can make the tape (52) dissociated. Additionally, the applying high temperature can make the temperature of the polymer layer (61) reach to its glass transition temperature and the applying pressure can make the material of the polymer layer (61) fully flow into the mold pattern (41); then, the applying high temperature can make the material of the polymer layer (61) solidified so that the imprint pattern (11) of the polymer layer (61) can completely correspond to the mold pattern (41). Preferably, the duration for the applying the high temperature and the pressure is from 1 minute to 20 minutes, but not limited thereto. Preferably, the applying high temperature is from 50° C. to 160° C., but not limited thereto. It is noted that the duration for applying the high temperature and the pressure and the high temperature range are determined according to the material of the polymer layer (61); on the whole, it is the principle that the top portion of the polymer layer (61) doesn't melt and the imprint pattern (11) is formed without any structure defects. Further, the applying pressure may be performed by applying a positive pressure to a surface of the soluble mold (4) opposite to the polymer layer (61); applying a negative pressure to a surface of the soluble mold (4) facing the polymer layer (61); or simultaneously applying a positive pressure to a surface of the soluble mold (4) opposite to the polymer layer (61) and a negative pressure to a surface of the soluble mold (4) facing the polymer layer (61). Preferably, the positive pressure is from +20 kPa to +600 kPa, and the negative pressure is from −10 kPa to 101.3 kPa, but not limited thereto. It is noted that applying the negative pressure can lead to the separation of the volatile solvent released by heat from the polymer layer (61) so as to avoid the released volatile solvent from remaining in the polymer layer (61) and to avoid the imprint pattern (11) from being formed with structure defects. Also shown in FIG. 5A, the imprint element (20) includes a heating element (201) configured for providing the high temperature and a blowing element (202) configured for providing the pressure, but not limited thereto.

In the example shown in FIG. 5B, since the taking device (5) includes the ring frame (51), the tape (52), and the support plate (53), the applying high temperature can make the adherence between the support plate (53) and the soluble mold (4) lowered or lost. Except for the above differences, the example described herein has the same operation details and the same technical functions as the example shown in FIG. 5A, and therefore there is no need for further description thereon.

In the example shown in FIG. 5C, since the taking device (5) includes the ring frame (51), the tape (52), and the support plate (53), the tape (52) is made of a heat-dissociable foam, and the dissociation temperature of the tape (52) (preferably from 80° C. to 150° C.) is lower than the applying high temperature, the applying high temperature can make the tape (52) dissociated. Except for the above differences, the example described herein has the same operation details and the same technical functions as the example shown in FIG. 5A, and therefore there is no need for further description thereon.

Figure 6:
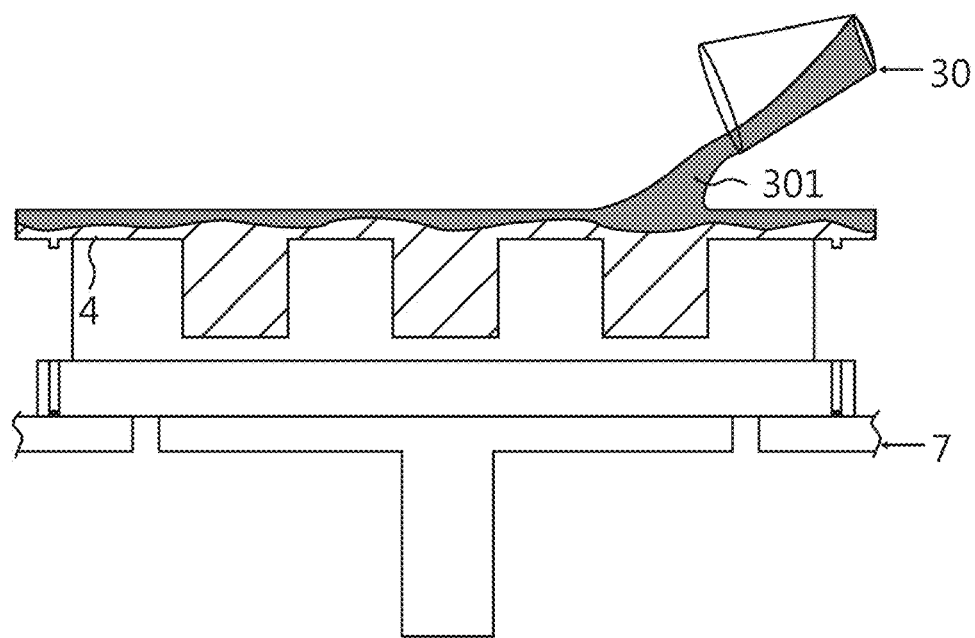
Figure 7:
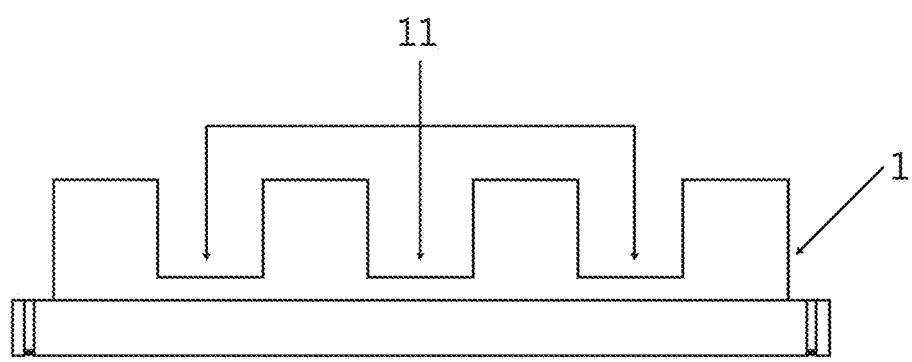

Finally, as shown in FIGS. 6-7, a solvent (301) is provided by using a dissolving element (30) to dissolve the soluble mold (4) to obtain an imprint workpiece (1) having the imprint pattern (11). As described above, the solvent (301) dissolution is well-known by people skilled in this art, and therefore there is no need for further description thereon.

The solvent (301) is determined according to the soluble mold (4). Preferably, while the soluble mold (4) is made of polyvinyl alcohol, the solvent (301) is water, but not limited thereto. Although FIG. 6 shows the solvent (301) dissolution is performed on the working platform (7), it may be done at any place out of the working platform (7).

Figure 10A:
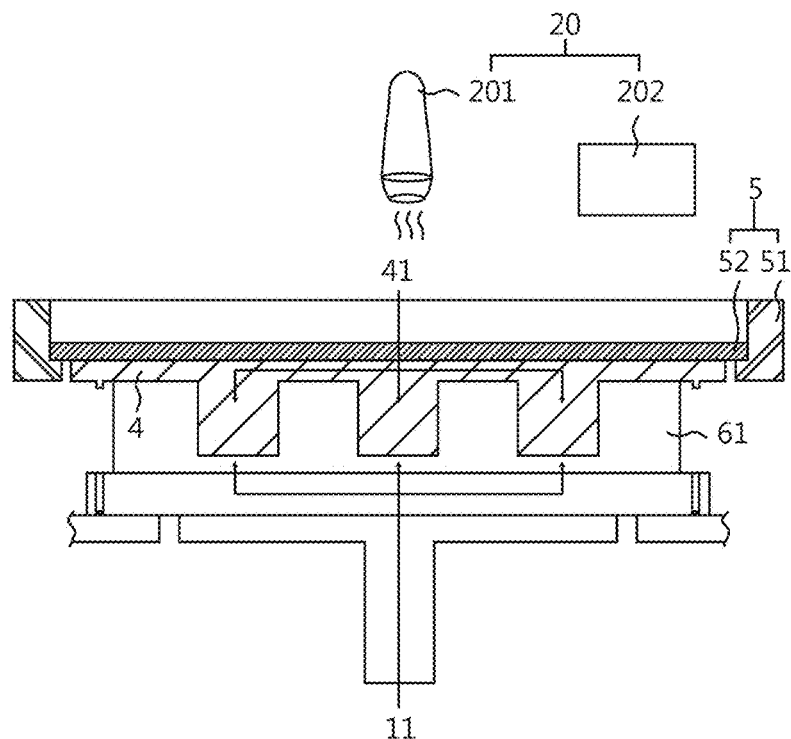
FIGS. 10A-11 are a series of schematic views illustrating part steps in an imprinting method according to an embodiment of the present invention.
Figure 11:
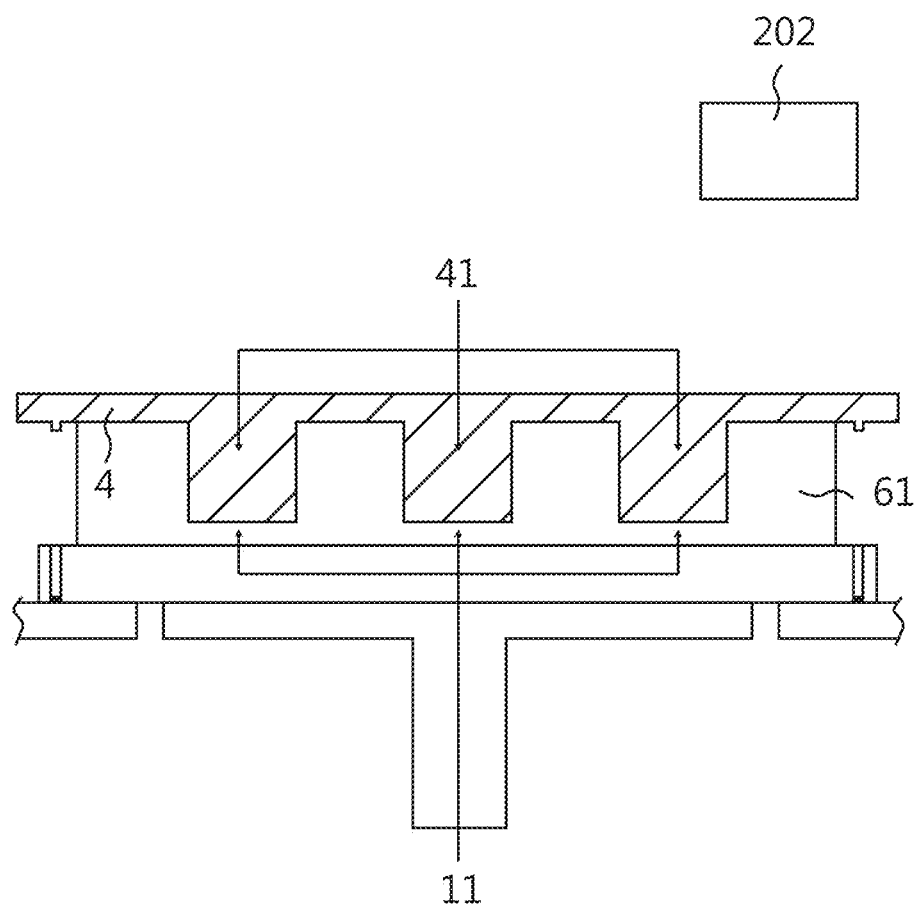

As shown in FIGS. 10A and 11, an imprinting method according to another embodiment of the present invention is illustrated, wherein the obtained imprint workpiece (1) has an imprint pattern (11). The imprint pattern (11) is not only clearly formed on the imprint workpiece (1), but also has a profile without structure defects. It is noted that the details of the method described herein is the same as that described above, except that the steps shown in FIGS. 10A and 11 are substituted for the step shown in FIG. 5A.

As shown in FIG. 10A, a first temperature and a pressure are applied to the soluble mold (4) by using an imprint element (20) to allow the polymer layer (61) having an imprint pattern (11) corresponding to the mold pattern (41) and to remove the taking device (5) from the soluble mold (4). Particularly, since the taking device (5) includes the ring frame (51) and the tape (52), the tape (52) is made of a heat-dissociable foam, and the dissociation temperature of the tape (52) (preferably from 80° C. to 150° C.) is lower than the applying first temperature, the applying first temperature can make the tape (52) dissociated. Additionally, the applying first temperature can make the temperature of the polymer layer (61) reach to its glass transition temperature and the applying pressure can make the material of the polymer layer (61) fully flow into the mold pattern (41). Preferably, the duration for the applying the first temperature and the pressure is from 1 minute to 20 minutes, but not limited thereto. Preferably, the applying first temperature is from 50° C. to 160° C., but not limited thereto. It is noted that the duration for applying the first temperature and the pressure and the first temperature range are determined according to the material of the polymer layer (61); on the whole, it is the principle that the top portion of the polymer layer (61) doesn't melt and the imprint pattern (11) is formed without any structure defects. Further, the applying pressure may be performed by applying a positive pressure to a surface of the soluble mold (4) opposite to the polymer layer (61); applying a negative pressure to a surface of the soluble mold (4) facing the polymer layer (61); or simultaneously applying a positive pressure to a surface of the soluble mold (4) opposite to the polymer layer (61) and a negative pressure to a surface of the soluble mold (4) facing the polymer layer (61). Preferably, the positive pressure is from +20 kPa to +600 kPa, and the negative pressure is from −10 kPa to 101.3 kPa, but not limited thereto. It is noted that applying the negative pressure can lead to the separation of the volatile solvent released by heat from the polymer layer (61) so as to avoid the released volatile solvent from remaining in the polymer layer (61) and to avoid the imprint pattern (11) from being formed with structure defects. Also shown in FIG. 10A, the imprint element (20) includes a heating element (201) configured for providing the first temperature and a blowing element (202) configured for providing the pressure, but not limited thereto.

As shown in FIG. 11, a second temperature is applied to the soluble mold (4) by using an imprint element (20), the second temperature being higher than the first temperature, to allow the polymer layer (61) being solidified. Particularly, the applying second temperature can make the temperature of the polymer layer (61) reach to its solidification temperature so that the material of the polymer layer (61) is crosslinked to be solidified. As such, the elasticity of the polymer layer (61) decreases so that the imprint pattern (11) of the polymer layer (61) completely corresponds to the mold pattern (41). Preferably, the second temperature is from 120° C. to 180° C., but not limited thereto. Applying the second temperature is especially suitable for the condition that the material of the polymer layer (61) is thermosetting resin (e.g. epoxy resin). Particularly, applying the second temperature can avoid the polymer layer (61) from deformation when the later-obtained imprint workpiece (1) is positioned at a temperature lower than the second temperature. As shown in FIG. 11, the second temperature may be provided by the heating element (201) of the imprint element (20).

Figure 10B:
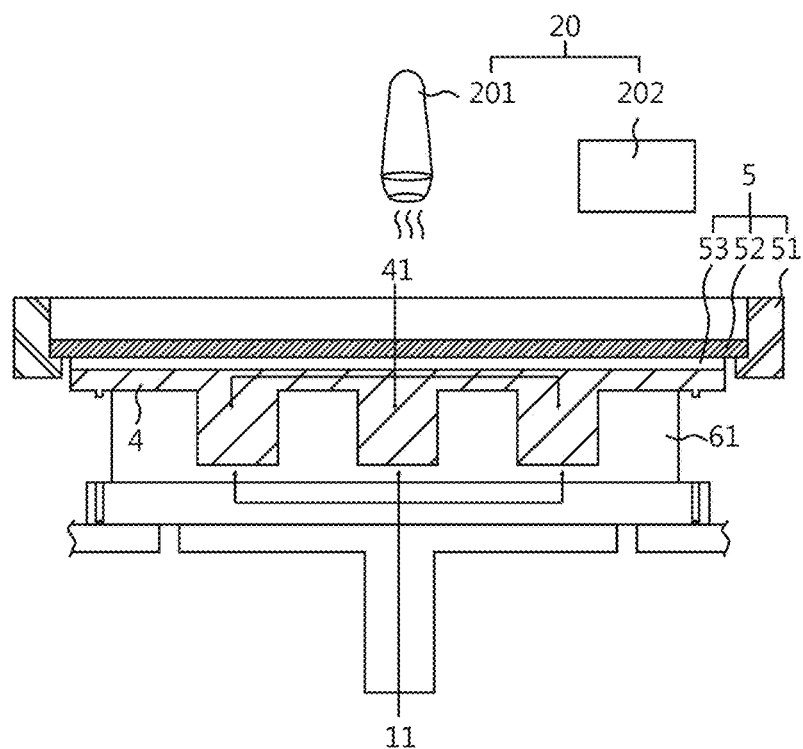

As shown in FIGS. 10B and 11, an imprinting method according to another embodiment of the present invention is illustrated, wherein the obtained imprint workpiece (1) has an imprint pattern (11). The imprint pattern (11) is not only clearly formed on the imprint workpiece (1), but also has a profile without structure defects. It is noted that the details of the method described herein is the same as that described above, except that the steps shown in FIGS. 10B and 11 are substituted for the step shown in FIG. 5B.

As shown in FIG. 10B, a first temperature and a pressure are applied to the soluble mold (4) by using an imprint element (20) to allow the polymer layer (61) having an imprint pattern (11) corresponding to the mold pattern (41) and to remove the taking device (5) from the soluble mold (4). Particularly, since the taking device (5) includes the ring frame (51), the tape (52), and the support plate (53), the applying first temperature can make the adherence between the support plate (53) and the soluble mold (4) lowered or lost. Additionally, the applying first temperature can make the temperature of the polymer layer (61) reach to its glass transition temperature and the applying pressure can make the material of the polymer layer (61) fully flow into the mold pattern (41). Preferably, the duration for the applying the first temperature and the pressure is from 1 minute to 20 minutes, but not limited thereto. Preferably, the applying first temperature is from 50° C. to 160° C., but not limited thereto. It is noted that the duration for applying the first temperature and the pressure and the first temperature range are determined according to the material of the polymer layer (61); on the whole, it is the principle that the top portion of the polymer layer (61) doesn't melt and the imprint pattern (11) is formed without any structure defects. Further, the applying pressure may be performed by applying a positive pressure to a surface of the soluble mold (4) opposite to the polymer layer (61); applying a negative pressure to a surface of the soluble mold (4) facing the polymer layer (61); or simultaneously applying a positive pressure to a surface of the soluble mold (4) opposite to the polymer layer (61) and a negative pressure to a surface of the soluble mold (4) facing the polymer layer (61). Preferably, the positive pressure is from +20 kPa to +600 kPa, and the negative pressure is from −10 kPa to 101.3 kPa, but not limited thereto. It is noted that applying the negative pressure can lead to the separation of the volatile solvent released by heat from the polymer layer (61) so as to avoid the released volatile solvent from remaining in the polymer layer (61) and to avoid the imprint pattern (11) from being formed with structure defects. Also shown in FIG. 10B, the imprint element (20) includes a heating element (201) configured for providing the first temperature and a blowing element (202) configured for providing the pressure, but not limited thereto.

As shown in FIG. 11, a second temperature is applied to the soluble mold (4) by using an imprint element (20), the second temperature being higher than the first temperature, to allow the polymer layer (61) being solidified. Particularly, applying the second temperature can make the temperature of the polymer layer (61) reach to its solidification temperature so that the material of the polymer layer (61) is crosslinked to be solidified. As such, the elasticity of the polymer layer (61) decreases so that the imprint pattern (11) of the polymer layer (61) completely corresponds to the mold pattern (41). Preferably, the second temperature is from 120° C. to 180° C., but not limited thereto. Applying the second temperature is especially suitable for the condition that the material of the polymer layer (61) is thermosetting resin (e.g. epoxy resin). Particularly, applying the second temperature can avoid the polymer layer (61) from deformation when the later-obtained imprint workpiece (1) is positioned at a temperature lower than the second temperature. As shown in FIG. 11, the second temperature may be provided by the heating element (201) of the imprint element (20).

Figure 10C:
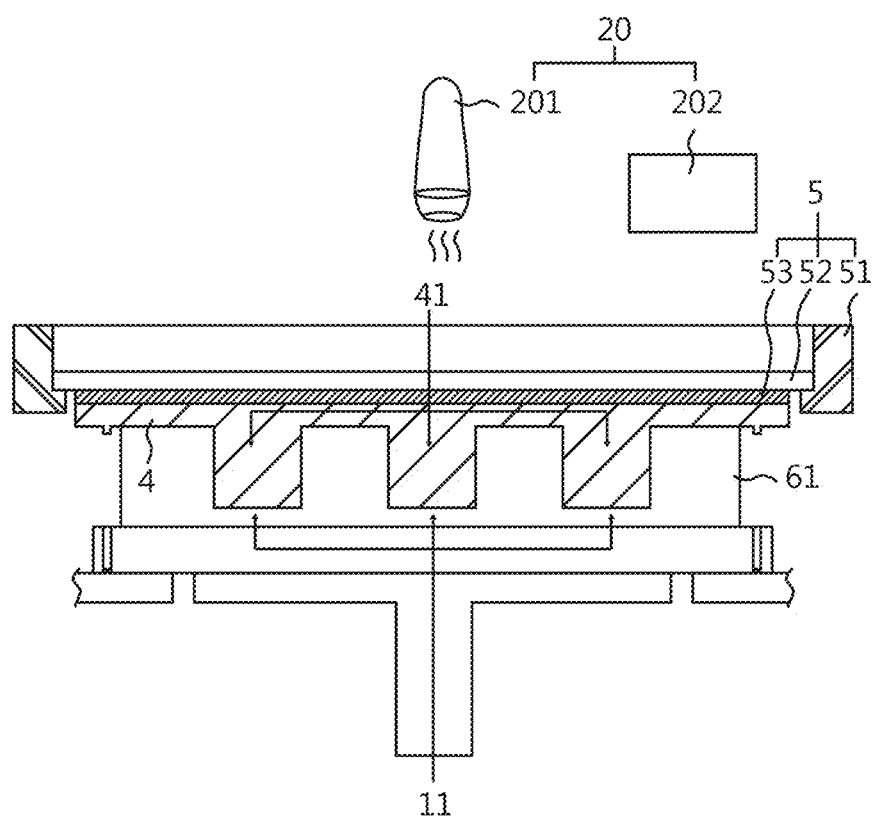

As shown in FIGS. 10C and 11, an imprinting method according to another embodiment of the present invention is illustrated, wherein the obtained imprint workpiece (1) has an imprint pattern (11). The imprint pattern (11) is not only clearly formed on the imprint workpiece (1), but also has a profile without structure defects. It is noted that the details of the method described herein is the same as that described above, except that the steps shown in FIGS. 10C and 11 are substituted for the step shown in FIG. 5A.

As shown in FIG. 10C, a first temperature and a pressure are applied to the soluble mold (4) by using an imprint element (20) to allow the polymer layer (61) having an imprint pattern (11) corresponding to the mold pattern (41) and to remove the taking device (5) from the soluble mold (4). Particularly, since the taking device (5) includes the ring frame (51), the tape (52), and the support plate (53), the tape (52) is made of a heat-dissociable foam, and the dissociation temperature of the tape (52) (preferably from 80° C. to 150° C.) is lower than the applying first temperature, the applying first temperature can make the tape (52) dissociated. Additionally, the applying first temperature can make the temperature of the polymer layer (61) reach to its glass transition temperature and the applying pressure can make the material of the polymer layer (61) fully flow into the mold pattern (41). Preferably, the duration for the applying the first temperature and the pressure is from 1 minute to 20 minutes, but not limited thereto. Preferably, the applying first temperature is from 50° C. to 160° C., but not limited thereto. It is noted that the duration for applying the first temperature and the pressure and the first temperature range are determined according to the material of the polymer layer (61); on the whole, it is the principle that the top portion of the polymer layer (61) doesn't melt and the imprint pattern (11) is formed without any structure defects. Further, the applying pressure may be performed by applying a positive pressure to a surface of the soluble mold (4) opposite to the polymer layer (61); applying a negative pressure to a surface of the soluble mold (4) facing the polymer layer (61); or simultaneously applying a positive pressure to a surface of the soluble mold (4) opposite to the polymer layer (61) and a negative pressure to a surface of the soluble mold (4) facing the polymer layer (61). Preferably, the positive pressure is from +20 kPa to +600 kPa, and the negative pressure is from −10 kPa to 101.3 kPa, but not limited thereto. It is noted that applying the negative pressure can lead to the separation of the volatile solvent released by heat from the polymer layer (61) so as to avoid the released volatile solvent from remaining in the polymer layer (61) and to avoid the imprint pattern (11) from being formed with structure defects. Also shown in FIG. 10C, the imprint element (20) includes a heating element (201) configured for providing the first temperature and a blowing element (202) configured for providing the pressure, but not limited thereto.

As shown in FIG. 11, a second temperature is applied to the soluble mold (4) by using an imprint element (20), the second temperature being higher than the first temperature, to allow the polymer layer (61) being solidified. Particularly, the applying second temperature can make the temperature of the polymer layer (61) reach to its solidification temperature so that the material of the polymer layer (61) is crosslinked to be solidified. As such, the elasticity of the polymer layer (61) decreases so that the imprint pattern (11) of the polymer layer (61) completely corresponds to the mold pattern (41). Preferably, the second temperature is from 120° C. to 180° C. Applying the second temperature is especially suitable for the condition that the material of the polymer layer (61) is thermosetting resin (e.g. epoxy resin). Particularly, applying the second temperature can avoid the polymer layer (61) from deformation when the later-obtained imprint workpiece (1) is positioned at a temperature lower than the second temperature. As shown in FIG. 11, the second temperature may be provided by the heating element (201) of the imprint element (20).

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An imprinting method, comprising:
   adding a soluble material to a master mold;
   solidifying the soluble material to form a soluble mold having a mold pattern;
   adhering a taking device to the soluble mold to separate the soluble mold from the master mold;
   placing the soluble mold onto a polymer layer of a workpiece for imprint;
   applying a temperature and a pressure to the soluble mold to allow the polymer layer having an imprint pattern corresponding to the mold pattern and being solidified, and to remove the taking device from the soluble mold, wherein the temperature is from 50° C. to 160° C.; and
   providing a solvent to dissolve the soluble mold to obtain an imprint workpiece having the imprint pattern.

2. The imprinting method as claimed in claim 1, wherein the separating step of the soluble mold from the master mold comprises:
   providing the taking device, the taking device including a ring frame, a tape, and a support plate, the ring frame having a support part and an operating part connected to the support part;
   adhering the support plate to the soluble mold;
   surrounding the support plate with the ring frame;
   adhering the tape to the support plate to attach a protrusion part of the tape to the support part of the ring frame; and
   operating the operating part of the ring frame to remove the soluble mold from the master mold; or the separating step of the soluble mold from the master mold comprises:
   providing the taking device, the taking device including a ring frame, a tape, and a support plate, the tape connected to a side of the ring frame, the support plate connected to a side of the tape facing the ring frame;
   adhering the tape to the soluble mold to attach the taking device to the soluble mold; and
   operating the ring frame to remove the soluble mold from the master mold.

3. The imprinting method as claimed in claim 1, wherein the soluble mold has a first alignment mark, and the placing step of the soluble mold onto the polymer layer comprises:
   depositing the workpiece for imprint on a working platform, the workpiece for imprint having a substrate layer positioned between the polymer layer and the working platform, the substrate layer having a second alignment mark;
   determining whether the first alignment mark and the second alignment mark are aligned with each other by using a camera positioned at a side of the taking device opposite to the soluble mold or another camera positioned at a side of the working platform opposite to the workpiece for imprint; and
   if the two alignment marks are aligned with each other, contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other; or the placing step of the soluble mold onto the polymer layer comprises:
   depositing the workpiece for imprint on a working platform, the workpiece for imprint having a substrate layer positioned between the polymer layer and the working platform, the substrate layer having a second alignment mark;
   contacting the soluble mold with the polymer layer; and
   determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a θ angle formed between the soluble mold and an x-y plane defined by the working platform, until the two alignment marks are aligned with each other; or the placing step of the soluble mold onto the polymer layer comprises:
   depositing the workpiece for imprint on a working platform, the workpiece for imprint having a substrate layer positioned between the polymer layer and the working platform, the substrate layer having a second alignment mark;
   moving a camera to a position between the soluble mold and the workpiece for imprint to determine whether the first alignment mark and the second alignment mark are aligned with each other; and
   if the two alignment marks are aligned with each other, restoring the position of the camera and contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

4. The imprinting method as claimed in claim 1, wherein the soluble mold has a first alignment mark, and the placing step of the soluble mold onto the polymer layer comprises:
 depositing the workpiece for imprint on a working platform, the workpiece for imprint having a substrate layer positioned between the polymer layer and the working platform, the working platform having a second alignment mark;
 determining whether the first alignment mark and the second alignment mark are aligned with each other by using a camera positioned at a side of the taking device opposite to the soluble mold or another camera positioned at a side of the working platform opposite to the workpiece for imprint; and
 if the two alignment marks are aligned with each other, contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:
 depositing the workpiece for imprint on a working platform, the workpiece for imprint having a substrate layer positioned between the polymer layer and the working platform, the working platform having a second alignment mark;
 contacting the soluble mold with the polymer layer; and
 determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other.

5. The imprinting method as claimed in claim 1, wherein the soluble mold has a first alignment mark, and the placing step of the soluble mold onto the polymer layer comprises:
 depositing the workpiece for imprint on a working platform, the workpiece for imprint having a substrate layer positioned between the polymer layer and the working platform, the polymer layer having a second alignment mark;
 determining whether the first alignment mark and the second alignment mark are aligned with each other by using a camera positioned at a side of the taking device opposite to the soluble mold or another camera positioned at a side of the working platform opposite to the workpiece for imprint; and
 if the two alignment marks are aligned with each other, contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:
 depositing the workpiece for imprint on a working platform, the workpiece for imprint having a substrate layer positioned between the polymer layer and the working platform, the polymer layer having a second alignment mark;
 contacting the soluble mold with the polymer layer; and
 determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:
 depositing the workpiece for imprint on a working platform, the workpiece for imprint having a substrate layer positioned between the polymer layer and the working platform, the polymer layer having a second alignment mark;
 moving a camera to a position between the soluble mold and the workpiece for imprint to determine whether the first alignment mark and the second alignment mark are aligned with each other; and
 if the two alignment marks are aligned with each other, restoring the position of the camera and contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other.

6. An imprinting method, comprising:
 adding a soluble material to a master mold;
 solidifying the soluble material to form a soluble mold having a mold pattern;
 adhering a taking device to the soluble mold to separate the soluble mold from the master mold;
 placing the soluble mold on a polymer layer of a workpiece for imprint;
 applying a first temperature and a pressure to the soluble mold to allow the polymer layer having an imprint pattern corresponding to the mold pattern and to remove the taking device from the soluble mold;
 applying a second temperature to the soluble mold, the second temperature being higher than the first temperature, to allow the polymer layer being solidified; and
 providing a solvent to dissolve the soluble mold to obtain an imprint workpiece having the imprint pattern.

7. The imprinting method as claimed in claim 6, wherein the separating step of the soluble mold from the master mold comprises:
 providing the taking device, the taking device including a ring frame, a tape, and a support plate, the ring frame having a support part and an operating part connected to the support part;
 adhering the support plate to the soluble mold;
 surrounding the support plate with the ring frame;
 adhering the tape to the support plate to attach a protrusion part of the tape to the support part of the ring frame; and
 operating the operating part of the ring frame to remove the soluble mold from the master mold; or the separating step of the soluble mold from the master mold comprises:

providing the taking device, the taking device including a ring frame, a tape, and a support plate, the tape connected to a side of the ring frame, the support plate connected to a side of the tape facing the ring frame;

adhering the tape to the soluble mold to attach the taking device to the soluble mold; and operating the ring frame to remove the soluble mold from the master mold.

8. The imprinting method as claimed in claim 6, wherein the soluble mold has a first alignment mark, and the placing step of the soluble mold onto the polymer layer comprises:

depositing the workpiece for imprint on a working platform, the workpiece for imprint having a substrate layer positioned between the polymer layer and the working platform, the substrate layer having a second alignment mark;

determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a 0 angle formed between the soluble mold and an x-y plane defined by the working platform, until the two alignment marks are aligned with each other; or the placing step of the soluble mold onto the polymer layer comprises:

depositing the workpiece for imprint on a working platform, the workpiece for imprint having a substrate layer positioned between the polymer layer and the working platform, the substrate layer having a second alignment mark;

contacting the soluble mold with the polymer layer; and determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:

depositing the workpiece for imprint on a working platform, the workpiece for imprint having a substrate layer positioned between the polymer layer and the working platform, the substrate layer having a second alignment mark;

moving a camera to a position between the soluble mold and the workpiece for imprint to determine whether the first alignment mark and the second alignment mark are aligned with each other; and if the two alignment marks are aligned with each other, restoring the position of the camera and contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other.

9. The imprinting method as claimed in claim 6, wherein the soluble mold has a first alignment mark, and the placing step of the soluble mold onto the polymer layer comprises:

depositing the workpiece for imprint on a working platform, the workpiece for imprint having a substrate layer positioned between the polymer layer and the working platform, the working platform having a second alignment mark;

determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:

depositing the workpiece for imprint on a working platform, the workpiece for imprint having a substrate layer positioned between the polymer layer and the working platform, the working platform having a second alignment mark;

contacting the soluble mold with the polymer layer; and determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other.

10. The imprinting method as claimed in claim 6, wherein the soluble mold has a first alignment mark, and the placing step of the soluble mold onto the polymer layer comprises:

depositing the workpiece for imprint on a working platform, the workpiece for imprint having a substrate layer positioned between the polymer layer and the working platform, the polymer layer having a second alignment mark;

determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are aligned with each other, contacting the soluble mold with the polymer layer; if the two alignment marks are not aligned with each other, adjusting an x-axis position and a y-axis position of the soluble mold and a $\theta$ angle formed between the soluble mold and an x-y plane defined by the working platform, until the two alignment marks are aligned with each other; or the placing step of the soluble mold onto the polymer layer comprises:

depositing the workpiece for imprint on a working platform, the workpiece for imprint having a substrate layer positioned between the polymer layer and the working platform, the polymer layer having a second alignment mark;

contacting the soluble mold with the polymer layer; and determining whether the first alignment mark and the second alignment mark are aligned with each other by using a camera positioned at a side of the taking device opposite to the soluble mold or another camera positioned at a side of the working platform opposite to the workpiece for imprint; and if the two alignment marks are not aligned with each other, adjusting an x-axis position and a y-axis position of the soluble mold and a θ angle formed between the soluble mold and an x-y plane defined by the working platform, until the two alignment marks are aligned with each other; or the placing step of the soluble mold onto the polymer layer comprises:

depositing the workpiece for imprint on a working platform, the workpiece for imprint having a substrate layer positioned between the polymer layer and the working platform, the polymer layer having a second alignment mark;

moving a camera to a position between the soluble mold and the workpiece for imprint to determine whether the first alignment mark and the second alignment mark are aligned with each other; and if the two alignment marks are aligned with each other, restoring the position of the camera and contacting the soluble mold with the polymer layer; if the two alignment marks are not aligned with each other, adjusting an x-axis position and a y-axis position of the soluble mold and a θ angle formed between the soluble mold and an x-y plane defined by the working platform, until the two alignment marks are aligned with each other.

* * * * *